(12) United States Patent
Sonobe

(10) Patent No.: US 12,322,744 B2
(45) Date of Patent: Jun. 3, 2025

(54) PHOTODETECTOR AND METHOD FOR MANUFACTURING PHOTODETECTOR

(71) Applicant: HAMAMATSU PHOTONICS K.K., Hamamatsu (JP)

(72) Inventor: Hironori Sonobe, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 787 days.

(21) Appl. No.: 17/311,803

(22) PCT Filed: Nov. 29, 2019

(86) PCT No.: PCT/JP2019/046907
§ 371 (c)(1),
(2) Date: Jun. 8, 2021

(87) PCT Pub. No.: WO2020/121857
PCT Pub. Date: Jun. 18, 2020

(65) Prior Publication Data
US 2022/0020786 A1 Jan. 20, 2022

(30) Foreign Application Priority Data
Dec. 12, 2018 (JP) .................... 2018-232895

(51) Int. Cl.
*H01L 27/144* (2006.01)
*H10F 39/10* (2025.01)

(52) U.S. Cl.
CPC ......... *H10F 39/103* (2025.01); *H10F 39/107* (2025.01)

(58) Field of Classification Search
CPC .................................................. H01L 27/1443
See application file for complete search history.

(56) References Cited

U.S. PATENT DOCUMENTS

| 4,181,863 A | 1/1980 | Parker |
| 4,247,186 A | 1/1981 | Uchidoi et al. |

(Continued)

FOREIGN PATENT DOCUMENTS

| CN | 1516362 A | 7/2004 |
| CN | 200950235 A | 9/2007 |

(Continued)

OTHER PUBLICATIONS

International Preliminary Report on Patentability mailed Jun. 24, 2021 for PCT/JP2019/046909.

(Continued)

*Primary Examiner* — Mounir S Amer
(74) *Attorney, Agent, or Firm* — Faegre Drinker Biddle & Reath LLP

(57) ABSTRACT

A light detection device includes a semiconductor substrate. The semiconductor substrate forms an APD and a temperature compensation diode so as to be spaced apart from each other when viewed from a direction perpendicular to a main surface. The semiconductor substrate includes a peripheral carrier absorbing portion surrounding the APD when viewed from the direction perpendicular to the first main surface and configured to absorb carriers located at the periphery. A part of the peripheral carrier absorbing portion is located between the APD and the temperature compensation diode when viewed from the direction perpendicular to the main surface.

13 Claims, 13 Drawing Sheets

(56) References Cited

U.S. PATENT DOCUMENTS

| | | |
|---|---|---|
| 4,292,514 A | 9/1981 | Ohtomo |
| 4,464,048 A | 8/1984 | Farlow |
| 4,948,989 A | 8/1990 | Spratt |
| 5,548,112 A | 8/1996 | Nakase et al. |
| 5,578,815 A | 11/1996 | Nakase et al. |
| 6,313,459 B1 | 11/2001 | Hoffe et al. |
| 6,504,140 B1 | 1/2003 | Ueno et al. |
| 8,350,351 B2 | 1/2013 | Koyama |
| 9,954,124 B1 | 4/2018 | Kuznetsov |
| 10,064,585 B2 | 9/2018 | Kimura et al. |
| 11,513,002 B2 | 11/2022 | Sonobe et al. |
| 2003/0117121 A1 | 6/2003 | Prescott |
| 2005/0092896 A1 | 5/2005 | Ichino |
| 2008/0138092 A1 | 6/2008 | Nagakubo |
| 2012/0101614 A1 | 4/2012 | Ghaemi et al. |
| 2015/0177394 A1 | 6/2015 | Dolinsky et al. |
| 2016/0084964 A1 | 3/2016 | Kimura et al. |
| 2016/0273959 A1 | 9/2016 | Wang |
| 2016/0373126 A1 | 12/2016 | Kim et al. |
| 2017/0031009 A1 | 2/2017 | Davidovic et al. |
| 2018/0214057 A1 | 8/2018 | Schultz et al. |
| 2018/0266881 A1 | 9/2018 | Fujiwara et al. |
| 2019/0310354 A1* | 10/2019 | Li .................. G01S 7/4868 |
| 2021/0134862 A1 | 5/2021 | Ishida et al. |
| 2021/0349188 A1* | 11/2021 | Tabata ............. G01S 17/894 |
| 2021/0376167 A1* | 12/2021 | Soneda ........... H01L 27/0676 |
| 2022/0020786 A1 | 1/2022 | Sonobe |
| 2022/0020805 A1* | 1/2022 | Sonobe ............... G01J 1/0214 |
| 2022/0020806 A1* | 1/2022 | Sonobe ........... H01L 27/1446 |
| 2022/0026268 A1* | 1/2022 | Sonobe ............. H01L 31/107 |
| 2022/0026269 A1 | 1/2022 | Sonobe |
| 2022/0026270 A1* | 1/2022 | Sonobe ........... H01L 27/1446 |
| 2022/0037548 A1* | 2/2022 | Sonobe ......... H01L 31/02027 |
| 2022/0037852 A1 | 2/2022 | Jung et al. |
| 2022/0246782 A1* | 8/2022 | Inoue ............ H01L 31/02027 |
| 2023/0083263 A1 | 3/2023 | Fujiwara et al. |

FOREIGN PATENT DOCUMENTS

| | | |
|---|---|---|
| CN | 200959101 A | 10/2007 |
| CN | 101484999 A | 7/2009 |
| CN | 201601136 U | 10/2010 |
| CN | 103728030 A | 4/2014 |
| CN | 103890972 A | 6/2014 |
| CN | 103907206 A | 7/2014 |
| DE | 102013100696 B3 | 11/2013 |
| EP | 1006591 A2 | 6/2000 |
| EP | 2040308 A1 | 3/2009 |
| EP | 2755235 A1 | 7/2014 |
| GB | 1231906 | 5/1971 |
| GB | 1503088 A | 3/1978 |
| GB | 1532262 | 11/1978 |
| GB | 1535824 | 12/1978 |
| JP | S50-062389 A | 5/1975 |
| JP | S53-041280 A | 4/1978 |
| JP | S55-127082 A | 10/1980 |
| JP | S60-178673 A | 9/1985 |
| JP | S60-180347 A | 9/1985 |
| JP | S60-211886 A | 10/1985 |
| JP | S61-038975 U | 3/1986 |
| JP | S61-289677 A | 12/1986 |
| JP | S62-239727 A | 10/1987 |
| JP | S62-279671 A | 12/1987 |
| JP | S64-013768 A | 1/1989 |
| JP | H01-118714 A | 5/1989 |
| JP | H03-021082 A | 1/1991 |
| JP | H04-111477 A | 4/1992 |
| JP | H04-256376 A | 9/1992 |
| JP | H05-235396 A | 9/1993 |
| JP | H05-275668 A | 10/1993 |
| JP | H06-224463 A | 8/1994 |
| JP | H07-027607 A | 1/1995 |
| JP | H7-063854 A | 3/1995 |
| JP | H7-263653 A | 10/1995 |
| JP | H08-207281 A | 8/1996 |
| JP | H10-247717 A | 9/1998 |
| JP | H11-275755 A | 10/1999 |
| JP | H11-284445 A | 10/1999 |
| JP | 2002-204149 A | 7/2002 |
| JP | 2004-281488 A | 10/2004 |
| JP | 2004-289206 A | 10/2004 |
| JP | 2004-303878 A | 10/2004 |
| JP | 2006-080416 A | 3/2006 |
| JP | 2007-266251 A | 10/2007 |
| JP | 2007-281509 A | 10/2007 |
| JP | 2008-148068 A | 6/2008 |
| JP | 2009-038157 A | 2/2009 |
| JP | 2013-164263 A | 8/2013 |
| JP | 2014-142340 A | 8/2014 |
| JP | 2018-174308 A | 11/2018 |
| SE | 417145 B | 2/1981 |
| TW | 201743459 A | 12/2017 |

OTHER PUBLICATIONS

International Preliminary Report on Patentability mailed Jun. 24, 2021 for PCT/JP2019/046900.

International Preliminary Report on Patentability mailed Jun. 24, 2021 for PCT/JP2019/046901.

International Preliminary Report on Patentability mailed Jun. 24, 2021 for PCT/JP2019/046881.

International Preliminary Report on Patentability mailed Jun. 24, 2021 for PCT/JP2019/046880.

International Preliminary Report on Patentability mailed Jun. 24, 2021 for PCT/JP2019/046907.

International Preliminary Report on Patentability mailed Jun. 24, 2021 for PCT/JP2019/046908.

* cited by examiner

PHOTODETECTOR AND METHOD FOR MANUFACTURING PHOTODETECTOR

TECHNICAL FIELD

The present invention relates to a light detection device and a method for manufacturing a light detection device.

BACKGROUND ART

A configuration is known in which a bias voltage applied to an avalanche photodiode is controlled in order to provide stable light detection with respect to temperature (for example, Patent Literature 1). In Patent Literature 1, a voltage corresponding to the breakdown voltage of a temperature compensation diode is applied to the avalanche photodiode as a bias voltage. Hereinafter, in this specification, the "avalanche photodiode" will be referred to as an "APD".

CITATION LIST

Patent Literature

Patent Literature 1: Japanese Unexamined Patent Publication No. H07-27607

SUMMARY OF INVENTION

Technical Problem

In Patent Literature 1, in order to provide temperature compensation for the multiplication factor of an APD for signal detection, an APD having the same temperature characteristics as the APD for signal detection is used as the temperature compensation diode described above. The closer the temperature characteristics of the APD for signal detection and the APD as a temperature compensation diode are, the higher the accuracy of temperature compensation of the light detection device can be. However, in order to achieve the desired temperature compensation accuracy, it has been necessary to make an examination for selecting and combining APDs having desired temperature characteristics with respect to the relationship between the amplification factor and the bias voltage. For this reason, it has been difficult to reduce the manufacturing cost of a light detection device including two APDs having desired temperature characteristics.

A light detection device is used for various applications. Therefore, it is expected to ensure the detection accuracy of the light detection device in an environment corresponding to each application. For example, when a light detection device is used in an in-vehicle application, it is expected to ensure the detection accuracy in a high temperature environment of 100° C. or higher. However, in such a high temperature environment, carriers due to heat are generated in the semiconductor substrate forming the APD. When the generated carriers reach the APD, photon shot noise occurs in the detection result of the APD.

An object of one aspect of the present invention is to provide a light detection device having improved detection accuracy while suppressing the manufacturing cost. An object of another aspect of the present invention is to provide a method for manufacturing a light detection device having improved detection accuracy while reducing the manufacturing cost. An object of still another aspect of the present invention is to provide a light detection device having improved detection accuracy while suppressing the manufacturing cost.

Solution to Problem

In the light detection device according to one aspect of the present invention, a voltage corresponding to a breakdown voltage applied to a temperature compensation diode is applied to an APD as a bias voltage to provide temperature compensation for the multiplication factor of the APD. The light detection device includes a semiconductor substrate. The semiconductor substrate has a first main surface and a second main surface facing each other. On the semiconductor substrate, the APD and the temperature compensation diode are formed so as to be spaced apart from each other when viewed from a direction perpendicular to the first main surface. The semiconductor substrate includes a peripheral carrier absorbing portion configured to absorb carriers located at the periphery. The peripheral carrier absorbing portion surrounds the APD when viewed from the direction perpendicular to the first main surface. A part of the peripheral carrier absorbing portion is located between the APD and the temperature compensation diode when viewed from the direction perpendicular to the first main surface.

In the one aspect described above, the peripheral carrier absorbing portion surrounds the APD when viewed from the direction perpendicular to the first main surface. Therefore, the carriers due to heat generated in the semiconductor substrate in a high temperature environment are suppressed from reaching the APD, enabling improvement of the detection accuracy.

In the one aspect described above, the APD and the temperature compensation diode are formed on the same semiconductor substrate. In this case, the temperature compensation diode and the APD having the same temperature characteristics with respect to the amplification factor and the bias voltage can be formed more easily and accurately than in a case where the temperature compensation diode and the APD are formed on different semiconductor substrates. Therefore, temperature compensation can be ensured for the multiplication factor while suppressing the manufacturing cost.

When a breakdown voltage is applied to the temperature compensation diode, the temperature compensation diode may emit light. When the temperature compensation diode emits light, carriers are generated in the semiconductor substrate due to the light emitted from the temperature compensation diode. Therefore, in a state in which the temperature compensation diode and the APD are formed on the same semiconductor substrate, the carriers may affect the detection result of the APD.

In the one aspect described above, the peripheral carrier absorbing portion is located between the APD and the temperature compensation diode. Therefore, the carriers generated due to the light emission of the temperature compensation diode are absorbed at the peripheral carrier absorbing portion before reaching the APD. As a result, the carriers due to the temperature compensation diode are suppressed from reaching the APD, enabling further improvement of the detection accuracy.

Therefore, in the light detection device described above, temperature compensation is ensured for the multiplication factor while suppressing the manufacturing cost, enabling improvement of the detection accuracy.

In the one aspect described above, an avalanche photodiode array including the avalanche photodiode may be formed on a side of the first main surface of the semiconductor substrate. The peripheral carrier absorbing portion may surround the avalanche photodiode array when viewed from the direction perpendicular to the first main surface. A part of the peripheral carrier absorbing portion may be located between the avalanche photodiode array and the temperature compensation diode when viewed from the direction perpendicular to the first main surface. In this case, even if carriers due to heat are generated in the semiconductor substrate in a high temperature environment, the generated carriers are suppressed from reaching the APD array. The carriers from the temperature compensation diode are also suppressed from reaching the APD array.

In the one aspect described above, the light detection device may include a first electrode, a second electrode, and a third electrode. The first electrode may be connected to the APD and be configured to output a signal from the APD. The second electrode may be connected to the temperature compensation diode. The third electrode may be connected to the peripheral carrier absorbing portion. In this case, a desired potential can be applied to each of the APD, the temperature compensation diode, and the peripheral carrier absorbing portion. When a voltage is applied to the peripheral carrier absorbing portion, the carriers generated in the temperature compensation diode can be further absorbed.

In the one aspect described above, a fourth electrode may be provided. The APD, the temperature compensation diode, and the peripheral carrier absorbing portion may be connected to the fourth electrode in parallel with each other. Since the APD and the temperature compensation diode are connected in parallel to each other, a potential corresponding to the breakdown voltage of the temperature compensation diode can be applied to the APD. Since the peripheral carrier absorbing portion is also connected in parallel to the APD and the temperature compensation diode, a potential can be applied to the peripheral carrier absorbing portion without providing a separate power supply. When a voltage is applied to the peripheral carrier absorbing portion, the carriers generated in the temperature compensation diode can be further absorbed.

In the one aspect described above, the semiconductor substrate may include a semiconductor region of a first conductivity type. Each of the APD and the temperature compensation diode may include a first semiconductor layer and a second semiconductor layer. The first semiconductor layer may be a second conductivity type different from the first conductivity type. The second semiconductor layer may be a first conductivity type having a higher impurity concentration than the semiconductor region. The second semiconductor layer may be located between the semiconductor region and the first semiconductor layer. In this case, the temperature compensation diode has the same configuration as the APD. Therefore, it is possible to easily form a temperature compensation diode whose temperature characteristics with respect to the amplification factor and the bias voltage are very similar to those of the APD.

In the one aspect described above, the peripheral carrier absorbing portion may include a third semiconductor layer of the second conductivity type. In this case, the carriers generated in the temperature compensation diode can be further absorbed at the peripheral carrier absorbing portion.

In the one aspect described above, the peripheral carrier absorbing portion may include a third semiconductor layer of the first conductivity type. In this case, the carriers generated in the temperature compensation diode can be further absorbed at the peripheral carrier absorbing portion.

In the one aspect described above, an impurity concentration in the second semiconductor layer of the temperature compensation diode may be higher than an impurity concentration in the second semiconductor layer of the APD. In this case, temperature compensation can be ensured for the multiplication factor of the APD operating in a linear mode.

In a method for manufacturing a light detection device according to another aspect of the present invention, a semiconductor wafer having a first main surface and including a semiconductor region of a first conductivity type is prepared. In the semiconductor wafer, ions are implanted into a first portion and a second portion which are spaced apart from each other when viewed from the direction perpendicular to the first main surface, to form, in each of the first and second portions, a first semiconductor layer and a second semiconductor layer. The first semiconductor layer is a second conductivity type different from the first conductivity type. The second semiconductor layer is located between the semiconductor region and the first semiconductor layer. The second semiconductor layer is a first conductivity type having a higher impurity concentration than the semiconductor region. In the manufacturing method, ions are further implanted into the second semiconductor layer in the first portion.

In another aspect described above, the APD and the temperature compensation diode are formed on the same semiconductor substrate. In this case, the temperature compensation diode and the APD having the same temperature characteristics with respect to the amplification factor and the bias voltage can be manufactured more easily and accurately than that in a case where the temperature compensation diode and the APD are formed on different semiconductor substrates. In other words, temperature compensation can be ensured for the multiplication factor while suppressing the manufacturing cost.

In another aspect described above, ions are implanted into the first portion and the second portion to form, in each of the first and second portions, the first semiconductor layer and the second semiconductor layer in each of the first and second portions. Then, ions are further implanted into the second semiconductor layer in the first portion. In this case, the temperature compensation diode and the APD each of which is set to the desired breakdown voltage can be easily manufactured while having the same temperature characteristics with respect to the amplification factor and the bias voltage. When each of the temperature compensation diode and the APD is set to the desired breakdown voltage, the detection accuracy can be improved.

Therefore, in the manufacturing method described above, temperature compensation is ensured for the multiplication factor while suppressing the manufacturing cost, enabling improvement the detection accuracy.

In another aspect described above, a first ion implantation process may include: forming the first semiconductor layer in each of the first and second portions and forming a third semiconductor layer of the second conductivity type in the third portion by one ion implantation process; and forming the second semiconductor layer in each of the first and second portions. The third portion may be spaced apart from the first and second portions when viewed from the direction perpendicular to the first main surface. The first semiconductor layer and the third semiconductor layer may be formed by implanting impurity ions of the second conductivity type into the first and second portions and the third portion. The second semiconductor layer may be formed by implanting impurity ions of the first conductivity type into the first and second portions. In this case, the peripheral carrier absorbing portion is formed without increasing the number of ion implantation processes. Therefore, the manufacturing cost is reduced.

A light detection device according to still another aspect of the present invention includes a semiconductor substrate. The semiconductor substrate has a first main surface and a second main surface facing each other. The semiconductor substrate includes a first APD, a second APD, and a peripheral carrier absorbing portion. The first APD has a light incidence surface on a side of the first main surface. The second APD is spaced apart from the first APD when viewed from a direction perpendicular to the first main surface and is shielded from light. The peripheral carrier absorbing portion surrounds the first APD when viewed from the direction perpendicular to the first main surface. The peripheral carrier absorbing portion is configured to absorb carriers located at a periphery. A part of the peripheral carrier absorbing portion is located between the first APD and the second APD when viewed from the direction perpendicular to the first main surface.

In still another aspect described above, the peripheral carrier absorbing portion surrounds the APD when viewed from the direction perpendicular to the first main surface. Therefore, the carriers due to heat generated in the semiconductor substrate in a high temperature environment are suppressed from reaching the APD, enabling improvement of the detection accuracy.

In still another aspect described above, two APDs are formed on the same semiconductor substrate. In this case, two APDs having desired temperature characteristics can be formed more easily and accurately than in a case where two APDs are formed on different semiconductor substrates. Therefore, a light detection device including two APDs having desired temperature characteristics can be provided while suppressing the manufacturing cost.

When a breakdown voltage is applied to the second APD, the second APD may emit light. When one APD emits light in a state in which two APDs are formed on the same semiconductor substrate, carriers are generated in the semiconductor substrate due to the light emitted from the one APD. Therefore, the carriers generated due to the second APD may affect the detection result of the first APD.

In the one aspect described above, a part of the peripheral carrier absorbing portion is located between the first APD and the second APD. Therefore, the carriers generated due to the light emission of the second APD are absorbed at the peripheral carrier absorbing portion before reaching the first APD. As a result, the carriers due to the second APD are suppressed from reaching the first APD, enabling improvement of the detection accuracy.

Therefore, in the light detection device described above, the detection accuracy can be improved while suppressing the manufacturing cost.

Advantageous Effects of Invention

According to one aspect of the present invention, it is possible to provide a light detection device having improved detection accuracy while suppressing the manufacturing cost. According to another aspect of the present invention, it is possible to provide a method for manufacturing a light detection device having improved detection accuracy while suppressing the manufacturing cost. According to still another aspect of the present invention, it is possible to provide a light detection device having improved detection accuracy while suppressing the manufacturing cost.

DESCRIPTION OF EMBODIMENTS

Figure 1:
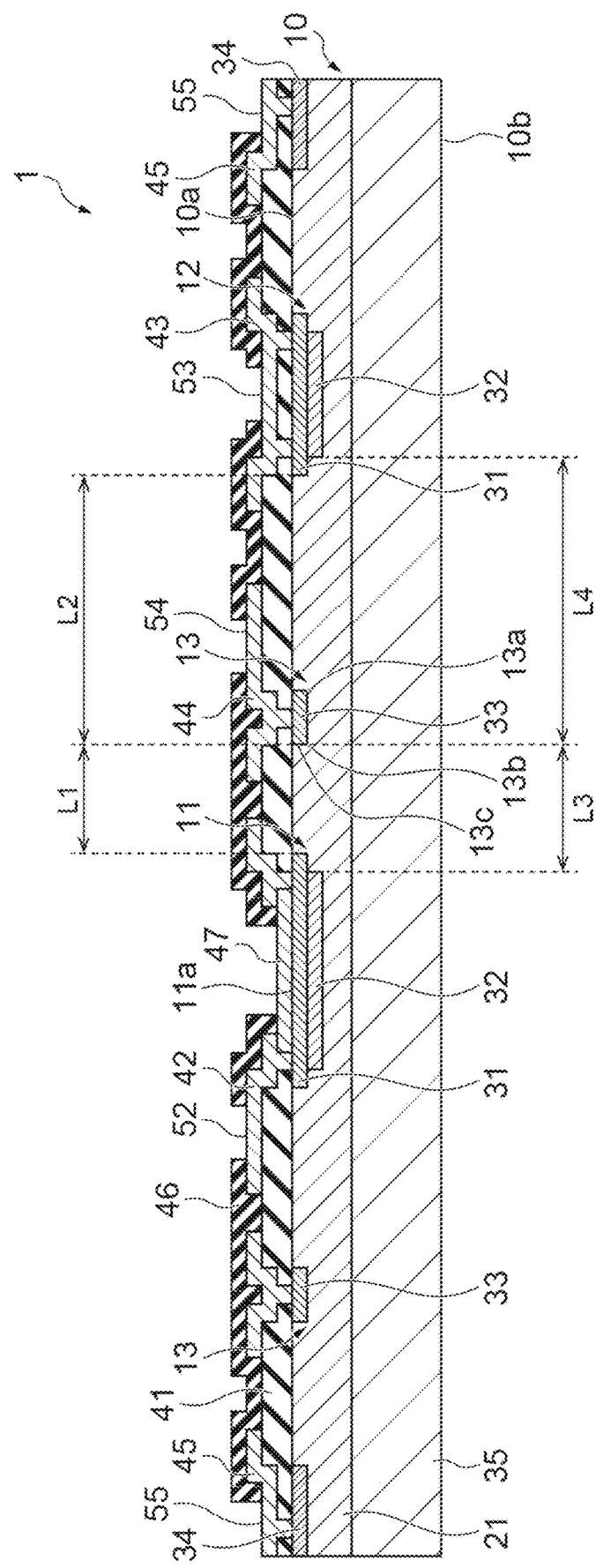
FIG. 1 is a schematic cross-sectional view of a light detection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

Figure 2:
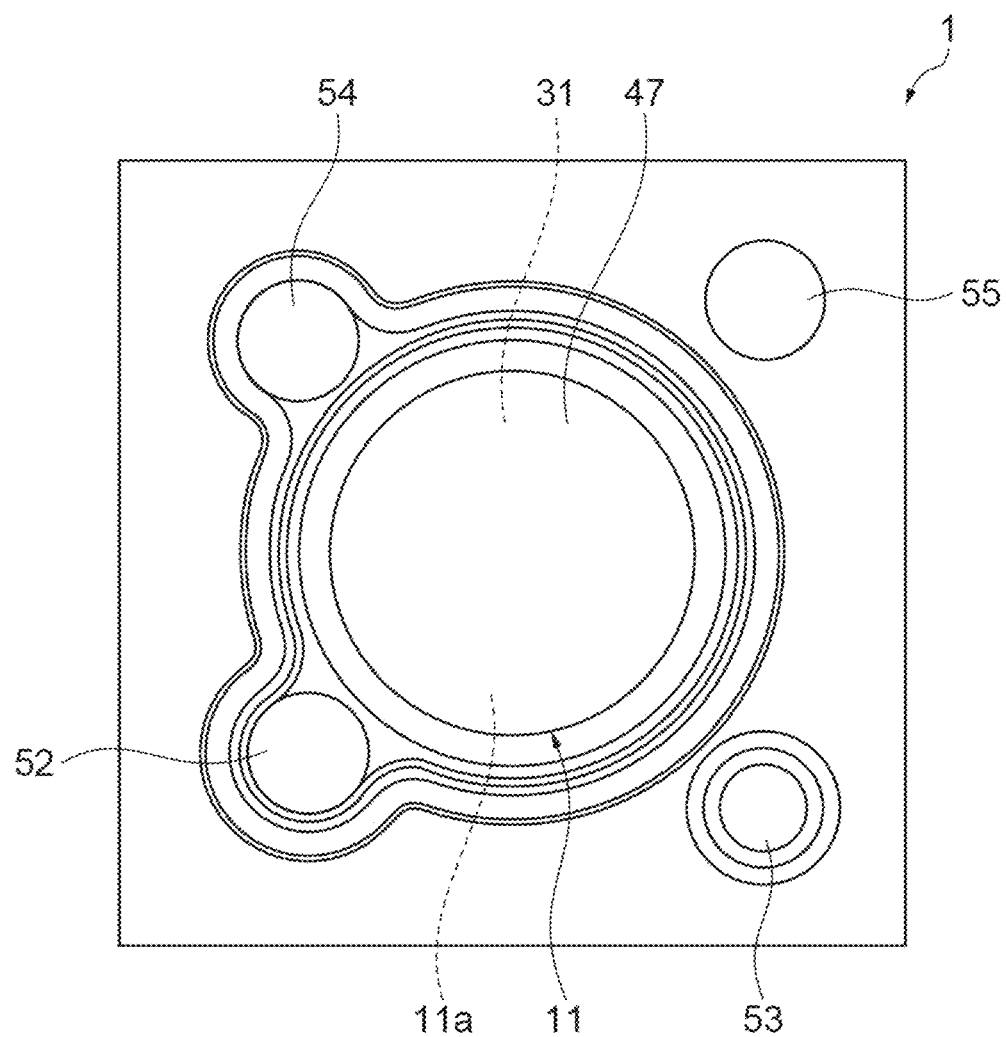
FIG. 2 is a plan view of the light detection device.
Figure 3:
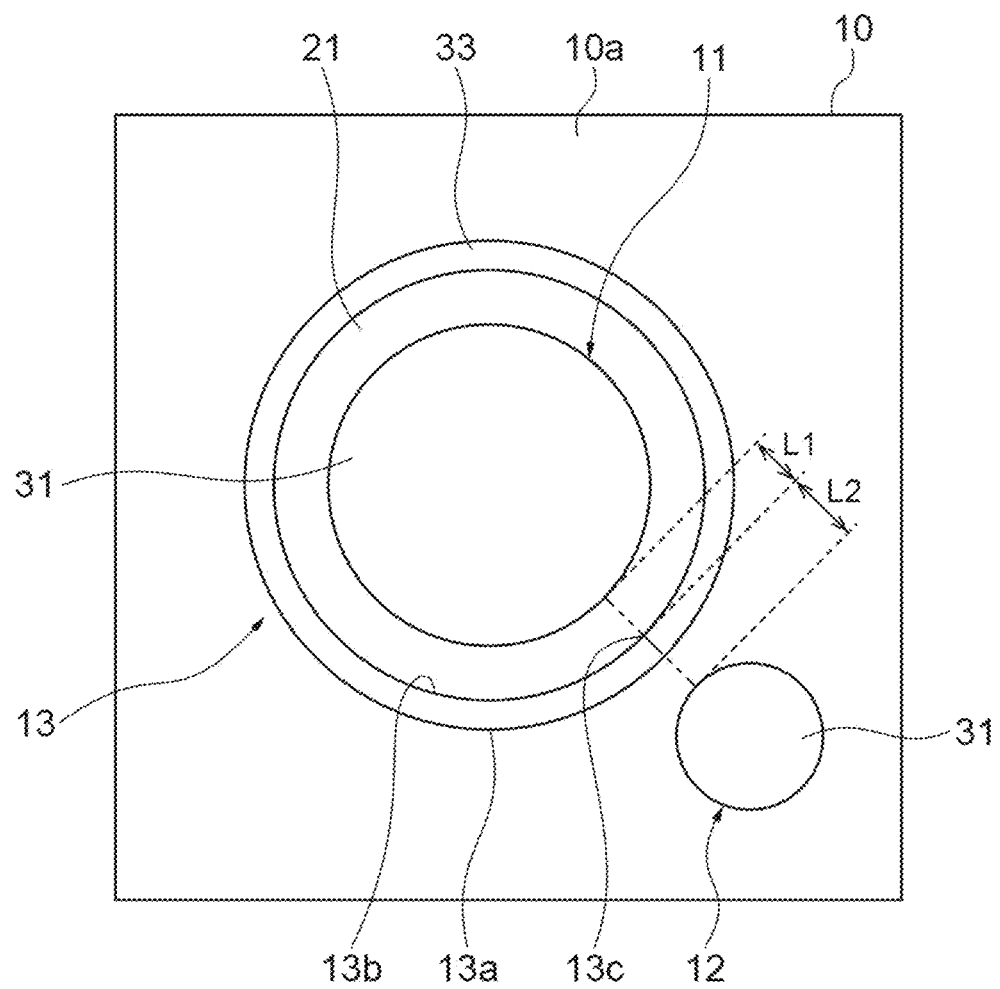
FIG. 3 is a schematic plan view of a semiconductor substrate.

First, a light detection device according to the present embodiment will be described with reference to FIGS. 1 to 3. A light detection device 1 includes a semiconductor substrate 10. FIG. 1 is a schematic cross-sectional view of a light detection device. FIG. 2 is a plan view of the light detection device. FIG. 3 is a schematic plan view of a semiconductor substrate included in the light detection device.

The semiconductor substrate 10 includes an APD 11 and a temperature compensation diode 12. The APD 11 and the temperature compensation diode 12 have the same temperature characteristics with respect to the relationship between the amplification factor and the bias voltage. In the present embodiment, the breakdown voltage of the APD 11 and the breakdown voltage of the temperature compensation diode 12 are different. In the present embodiment, the breakdown voltage of the APD 11 is higher than the breakdown voltage of the temperature compensation diode 12.

In the light detection device 1, since a breakdown voltage is applied to the temperature compensation diode 12, a voltage corresponding to the breakdown voltage is applied to the APD 11 as a bias voltage. In the present embodiment, the breakdown voltage of the temperature compensation diode 12 is applied to the APD 11 as a bias voltage. The APD 11 and the temperature compensation diode 12 have the same temperature characteristics with respect to the relationship between the amplification factor and the bias voltage. In this case, when the ambient temperature changes, the breakdown voltage applied to the temperature compensation diode 12 changes. By the change in the breakdown voltage applied to the temperature compensation diode 12, the bias voltage applied to the APD 11 also changes according to the ambient temperature so that the amplification factor of the APD 11 is maintained. That is, in the light detection device 1, the temperature compensation diode 12 provides temperature compensation for the amplification factor of the APD 11.

As illustrated in FIG. 1, the semiconductor substrate 10 has main surfaces 10a and 10b facing each other. The APD 11 and the temperature compensation diode 12 are formed on the semiconductor substrate 10 so as to be spaced apart from each other when viewed from a direction perpendicular to the main surface 10a. The APD 11 has a light incidence surface 11a on the main surface 10a side. The temperature compensation diode 12 is a light-shielded APD.

The semiconductor substrate 10 includes a peripheral carrier absorbing portion 13 in addition to the APD 11 and the temperature compensation diode 12. A part of the peripheral carrier absorbing portion 13 is located between the APD 11 and the temperature compensation diode 12 when viewed from the direction perpendicular to the main surface 10a. The peripheral carrier absorbing portion 13 surrounds the APD 11. The peripheral carrier absorbing portion 13 is a region that absorbs carriers located at the periphery.

Next, the configuration of the light detection device according to the present embodiment will be described in more detail with reference to FIG. 1. The semiconductor substrate 10 includes a semiconductor region 21 and semiconductor layers 31, 32, 33, 34, and 35. Each of the APD 11 and the temperature compensation diode 12 includes the semiconductor region 21 and the semiconductor layers 31, 32, and 35.

The peripheral carrier absorbing portion 13 includes the semiconductor region 21 and the semiconductor layers 33 and 35. The peripheral carrier absorbing portion 13 absorbs carriers located at the periphery in the semiconductor layer 33. That is, the semiconductor layer 33 functions as a peripheral carrier absorbing layer that absorbs peripheral carriers. In the present embodiment, the peripheral carrier absorbing portion 13 is a portion of the semiconductor substrate 10 surrounded by edges 13a and 13b of the peripheral carrier absorbing layer when viewed from the direction perpendicular to the main surface 10a. In the present embodiment, the edges 13a and 13b are edges of the semiconductor layer 33. The edge 13b is located closer to the APD 11 than the edge 13a.

The semiconductor region 21 and the semiconductor layers 32, 34, and 35 are the first conductivity type, and the semiconductor layers 31 and 33 are the second conductivity type. Semiconductor impurities are added by, for example, a diffusion method or an ion implantation method. In the present embodiment, the first conductivity type is P type and the second conductivity type is N type. When the semiconductor substrate 10 is an Si-based substrate, a Group 13 element such as B is used as the P-type impurity, and a Group 15 element such as N, P, or As is used as the N-type impurity.

The semiconductor region 21 is located on the main surface 10a side of the semiconductor substrate 10. The semiconductor region 21 forms a part of the main surface 10a. The semiconductor region 21 is, for example, P⁻ type.

The semiconductor layer 31 forms a part of the main surface 10a. The semiconductor layer 31 is surrounded by the semiconductor region 21 so as to be in contact with the semiconductor region 21 when viewed from the direction perpendicular to the main surface 10a. The semiconductor layer 31 is, for example, N⁺ type. In the present embodiment, the semiconductor layer 31 forms a cathode in each of the APD 11 and the temperature compensation diode 12.

The semiconductor layer 32 is located between the semiconductor region 21 and the semiconductor layer 31. In other words, the semiconductor layer 32 is in contact with the semiconductor layer 31 on the main surface 10a side and is in contact with the semiconductor region 21 on the main surface 10b side. The semiconductor layer 32 has a higher impurity concentration than the semiconductor region 21. The semiconductor layer 32 is, for example, P type. In the present embodiment, the impurity concentration of the semiconductor layer 32 of the temperature compensation diode 12 is higher than the impurity concentration of the semiconductor layer 32 of the APD 11. The semiconductor layer 32 forms an avalanche region in each of the APD 11 and the temperature compensation diode 12.

The semiconductor layer 33 forms a part of the main surface 10a. The semiconductor layer 33 is surrounded by the semiconductor region 21 so as to be in contact with the semiconductor region 21 when viewed from the direction perpendicular to the main surface 10a. In the present embodiment, the peripheral carrier absorbing portion 13 includes the semiconductor layer 33, and is in contact with only the semiconductor region 21 of the semiconductor substrate 10. The peripheral carrier absorbing portion 13 does not include a layer corresponding to the avalanche region. In the present embodiment, the semiconductor layer 33 has the same impurity concentration as the semiconductor layer 31. The semiconductor layer 33 is, for example, N⁺ type.

The semiconductor layer 34 forms a part of the main surface 10a. The semiconductor layer 34 is surrounded by the semiconductor region 21 so as to be in contact with the semiconductor region 21 when viewed from the direction perpendicular to the main surface 10a. In the present embodiment, the semiconductor layer 34 has a higher impurity concentration than the semiconductor region 21 and the semiconductor layer 32. The semiconductor layer 34 is, for example, P⁺ type. The semiconductor layer 34 is connected to the semiconductor layer 35 at a portion that is not illustrated. The semiconductor layer 34 forms an anode of the light detection device 1. The semiconductor layer 34 forms, for example, anodes of the APD 11, the temperature compensation diode 12, and the peripheral carrier absorbing portion 13.

The semiconductor layer 35 is located closer to the main surface 10b of the semiconductor substrate 10 than the semiconductor region 21. The semiconductor layer 35 forms the entire main surface 10b. The semiconductor layer 35 is in contact with the semiconductor region 21 on the main surface 10a side. In the present embodiment, the semiconductor layer 35 has a higher impurity concentration than the semiconductor region 21 and the semiconductor layer 32. The semiconductor layer 35 is, for example, P⁺ type. The semiconductor layer 35 forms an anode of the light detection device 1. The semiconductor layer 35 forms, for example, anodes of the APD 11, the temperature compensation diode 12, and the peripheral carrier absorbing portion 13.

The light detection device 1 further includes an insulating film 41, electrodes 42, 43, 44, and 45, a passivation film 46, and an antireflection film 47 that are provided on the main surface 10a of the semiconductor substrate 10. The insulating film 41 is stacked on the main surface 10a of the semiconductor substrate 10. The insulating film 41 is, for example, a silicon oxide film. Each of the electrodes 42, 43, 44, and 45 is disposed on the insulating film 41. The passivation film 46 is stacked on the insulating film 41 and the electrodes 42, 43, 44, and 45. The antireflection film 47 is stacked on the main surface 10a of the semiconductor substrate 10.

The electrode 42 penetrates the insulating film 41 to be connected to the semiconductor layer 31 of the APD 11. A part of the electrode 42 is exposed from the passivation film 46 to form a pad electrode 52 of the APD 11. The electrode 42 outputs a signal from the APD 11 at the pad electrode 52. The electrode 43 penetrates the insulating film 41 to be connected to the semiconductor layer 31 of the temperature compensation diode 12. A part of the electrode 43 is exposed from the passivation film 46 to form, for example, a pad electrode 53 of the temperature compensation diode 12.

The electrode 44 penetrates the insulating film 41 to be connected to the semiconductor layer 33 of the peripheral carrier absorbing portion 13. A part of the electrode 44 is exposed from the passivation film 46 to form, for example, a pad electrode 54 of the peripheral carrier absorbing portion 13. The electrode 45 penetrates the insulating film 41 to be connected to the semiconductor layer 34. That is, the electrode 45 is connected to the APD 11, the temperature compensation diode 12, and the peripheral carrier absorbing portion 13. In other words, the APD 11, the temperature compensation diode 12, and the peripheral carrier absorbing portion 13 are connected to the electrode 45 in parallel with each other. A part of the electrode 45 is exposed from the passivation film 46 to form, for example, a pad electrode 55.

In the present embodiment, the pad electrodes 52, 53, 54, 55 are disposed around the APD 11 as illustrated in FIG. 2 when the light detection device 1 is viewed from the direction perpendicular to the main surface 10a. In the present embodiment, the pad electrode 52 is a pad electrode for the cathode of the APD 11. The pad electrode 53 is a pad electrode for the cathode of the temperature compensation diode 12. The pad electrode 54 is a pad electrode for the cathode of the peripheral carrier absorbing portion 13. The pad electrode 55 is a pad electrode for the anodes of the APD 11, the temperature compensation diode 12, and the peripheral carrier absorbing portion 13.

The APD 11, the temperature compensation diode 12, and the peripheral carrier absorbing portion 13 are connected to the pad electrode 55 in parallel with each other. When a reverse bias is applied to the APD 11, the temperature compensation diode 12, and the peripheral carrier absorbing portion 13, a positive voltage is applied to the pad electrode for the cathode, and a negative voltage is applied to the pad electrode for the anode.

The antireflection film 47 is stacked on the semiconductor layer 31 of the APD 11. A part of the antireflection film 47 is exposed from the passivation film 46. Therefore, light transmitted through the antireflection film 47 can enter the semiconductor layer 31 of the APD 11. The semiconductor layer 31 of the temperature compensation diode 12 and the semiconductor layer 33 of the peripheral carrier absorbing portion 13 are covered with the insulating film 41 and are shielded from light. Therefore, when the light detection device 1 is viewed from the main surface 10a side in the direction perpendicular to the main surface 10a, the semiconductor layer 31 of the APD 11 is visible as illustrated in FIG. 2. The semiconductor layer 31 of the temperature compensation diode 12 and the semiconductor layer 33 of the peripheral carrier absorbing portion 13 are not visible.

FIG. 3 is a schematic plan view of the semiconductor substrate 10 viewed from the main surface 10a side in the direction perpendicular to the main surface 10a. As illustrated in FIG. 3, the semiconductor layer 31 of the APD 11 and the semiconductor layer 31 of the temperature compensation diode 12 have a circular shape when viewed from the direction perpendicular to the main surface 10a. The semiconductor layer 33 of the peripheral carrier absorbing portion 13 has an annular shape when viewed from the direction perpendicular to the main surface 10a, and surrounds the semiconductor layer 31 so as to be spaced apart from the semiconductor layer 31 of the APD 11. A part of the semiconductor layer 33 is located between the semiconductor layer 31 of the APD 11 and the semiconductor layer 31 of the temperature compensation diode 12 when viewed from the direction perpendicular to the main surface 10a. In other words, the peripheral carrier absorbing portion 13 is located between the APD 11 and the temperature compensation diode 12 when viewed from the direction perpendicular to the main surface 10a.

When viewed from the direction perpendicular to the main surface 10a, on the line segment connecting the APD 11 and the temperature compensation diode 12 to each other at the shortest distance, the shortest distance between the APD 11 and the peripheral carrier absorbing portion 13 is smaller than the shortest distance between a portion 13c of the peripheral carrier absorbing portion 13 and the temperature compensation diode 12. The portion 13c is a portion, which is closest to the APD 11, of the edges 13a and 13b of the peripheral carrier absorbing portion 13 on the line segment connecting the APD 11 and the temperature compensation diode 12 to each other at the shortest distance. In other words, the portion 13c is a portion, which is closest to the temperature compensation diode 12, of the edge 13b of the peripheral carrier absorbing portion 13 when viewed from the direction perpendicular to the main surface 10a.

More specifically, when viewed from the direction perpendicular to the main surface 10a, the distance L1 is smaller than the distance L2 on the line segment connecting the semiconductor layer 31 of the APD 11 and the semiconductor layer 31 of the temperature compensation diode 12 to each other at the shortest distance. As illustrated in FIGS. 1 and 3, the distance L1 is the shortest distance between the semiconductor layer 31 of the APD 11 and the peripheral carrier absorbing portion 13 when viewed from the direction perpendicular to the main surface 10a. The distance L2 is the shortest distance between the portion 13c of the peripheral carrier absorbing portion 13 and the semiconductor layer 31 of the temperature compensation diode 12 when viewed from the direction perpendicular to the main surface 10a. L2/L1 is, for example, more than 1 and 50 or less. L2/L1 may be 20 or more and 50 or less.

As illustrated in FIG. 1, when viewed from the direction perpendicular to the main surface 10a, the distance L3 is smaller than the distance L4 on the line segment connecting the semiconductor layer 32 of the APD 11 and the semiconductor layer 32 of the temperature compensation diode 12 to each other at the shortest distance. The distance L3 is the shortest distance between the semiconductor layer 32 of the APD 11 and the peripheral carrier absorbing portion 13 when viewed from the direction perpendicular to the main surface 10a. The distance L4 is the shortest distance between the portion 13c of the peripheral carrier absorbing portion 13 and the semiconductor layer 32 of the temperature compensation diode 12 when viewed from the direction perpendicular to the main surface 10a.

Figure 4:
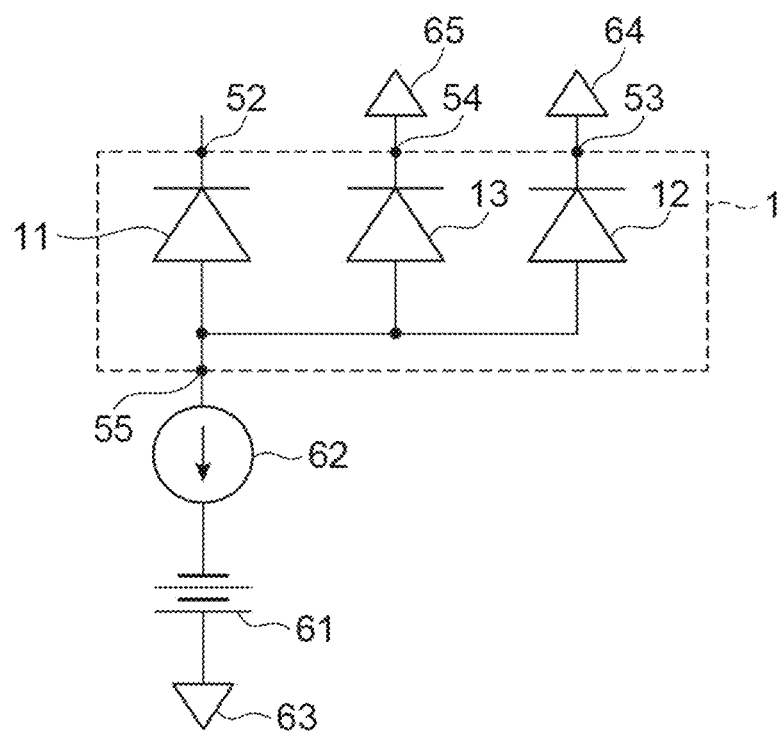
FIG. 4 is a diagram for describing the circuit configuration of the light detection device.

Next, the operation of the light detection device according to the present embodiment will be described with reference to FIG. 4. The light detection device 1 is used in a state in which a power supply 61 and a current limiting circuit 62 are connected to the pad electrode 55. The positive electrode side of the power supply 61 is connected to the ground 63, and the negative electrode side of the power supply 61 is connected to the pad electrode 55 through the current limiting circuit 62. The pad electrodes 53 and 54 are connected to the grounds 64 and 65, respectively. The grounds 64 and 65 may be connected to each other. The pad electrode 52 is connected to a signal reading circuit (not illustrated).

In the present embodiment, the pad electrode 55 is connected to the semiconductor layer 34 of the P$^+$ type, and the semiconductor layer 34 is connected to the semiconductor layer 35 of the P$^+$ type. Therefore, the anodes of the APD 11, the temperature compensation diode 12, and the peripheral carrier absorbing portion 13 are connected to the pad electrode 55 in parallel with each other. As a result, a negative potential is applied to the anodes of the APD 11, the temperature compensation diode 12, and the peripheral carrier absorbing portion 13 by the power supply 61.

The difference between the potential applied to the pad electrode 53 and the potential applied to the pad electrode 55 is a breakdown voltage of the temperature compensation diode 12. Therefore, a potential corresponding to the breakdown voltage applied to the temperature compensation diode 12 is applied to the anode of the APD 11. As a result, a voltage corresponding to the breakdown voltage applied to the temperature compensation diode 12 is applied to the APD 11 as a bias voltage. Similarly, a voltage corresponding to the breakdown voltage applied to the temperature compensation diode 12 is applied to the anode of the peripheral carrier absorbing portion 13 as a bias voltage.

In the present embodiment, since a combination of the power supply 61 and the current limiting circuit 62 is connected to the pad electrode 55, the breakdown voltage of the temperature compensation diode 12 is applied to the pad electrode 55. Therefore, the breakdown voltage of the temperature compensation diode 12 is applied to the APD 11 and the peripheral carrier absorbing portion 13 as a bias voltage. In the present embodiment, the output voltage of the power supply 61 is equal to or higher than the operating voltage of the APD 11. In other words, the output voltage of the power supply 61 is equal to or higher than the upper limit of the temperature fluctuation of the breakdown voltage of the temperature compensation diode 12. For example, the output voltage of the power supply 61 is 300 V or higher. The current limiting circuit 62 is configured to include, for example, a current mirror circuit or a resistor. In this case, for example, the multiplication factor of the APD 11 can be arbitrarily set according to the breakdown voltage difference between the temperature compensation diode 12 and the APD 11. When the amplification factor of the APD 11 is set to an optimal multiplication factor Mopt having a high S/N ratio, the detection accuracy can be improved.

In the present embodiment, the anodes of the APD 11, the temperature compensation diode 12, and the peripheral carrier absorbing portion 13 are integrally formed in the semiconductor layer 35. For example, when the potential applied to the pad electrode 53 is 0 V and the breakdown voltage of the temperature compensation diode 12 is 130 V under an ambient temperature of 25° C., a potential of −130 V is applied to the anode of the APD 11 and the anode of the peripheral carrier absorbing portion 13. Therefore, when the breakdown voltage of the APD 11 is 150 V under an ambient temperature of 25° C., the APD 11 operates in a state in which the potential difference between the anode and the cathode is lower by 20 V than the breakdown voltage.

The APD 11 and the temperature compensation diode 12 have the same temperature characteristics with respect to the relationship between the amplification factor and the bias voltage. Therefore, as long as the temperature compensation diode 12 is in a breakdown state, the APD 11 operates while maintaining the amplification factor when a bias voltage lower by 20 V than the breakdown voltage is applied under an ambient temperature of 25° C. In other words, in the light detection device 1, since a voltage that causes the temperature compensation diode 12 to break down is applied to the temperature compensation diode 12, temperature compensation is provided for the amplification factor of the APD 11.

In the present embodiment, the configuration in which the so-called reach-through type APD 11 operates in a linear mode has been described. The light detection device 1 may have a configuration in which the reach-through type APD 11 arranged to operate in Geiger mode. In the configuration in which the APD 11 arranged to operate in Geiger mode, a quenching resistor is connected to the APD 11. The semiconductor substrate 10 is configured such that the impurity concentration of the semiconductor layer 32 of the temperature compensation diode 12 is lower than the impurity concentration of the semiconductor layer 32 of the APD 11.

Figure 5:
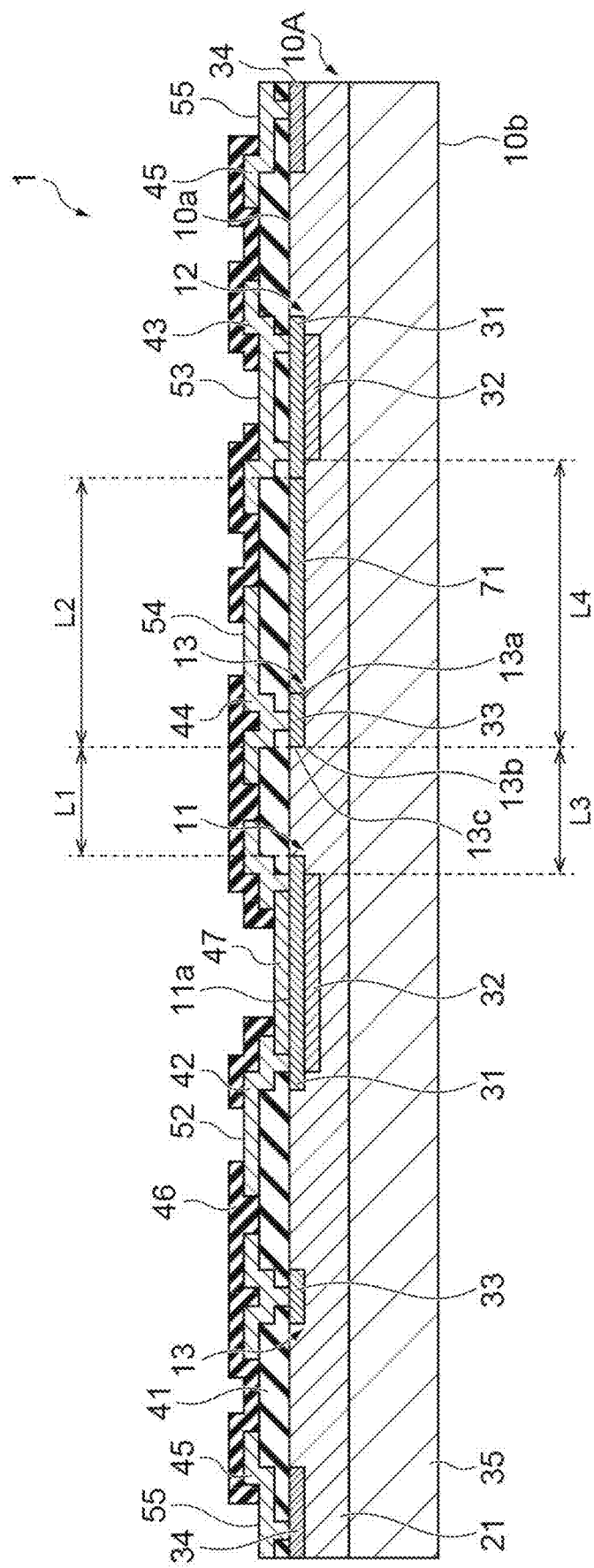
FIG. 5 is a schematic cross-sectional view of a light detection device according to a modification example of the present embodiment.
Figure 6:
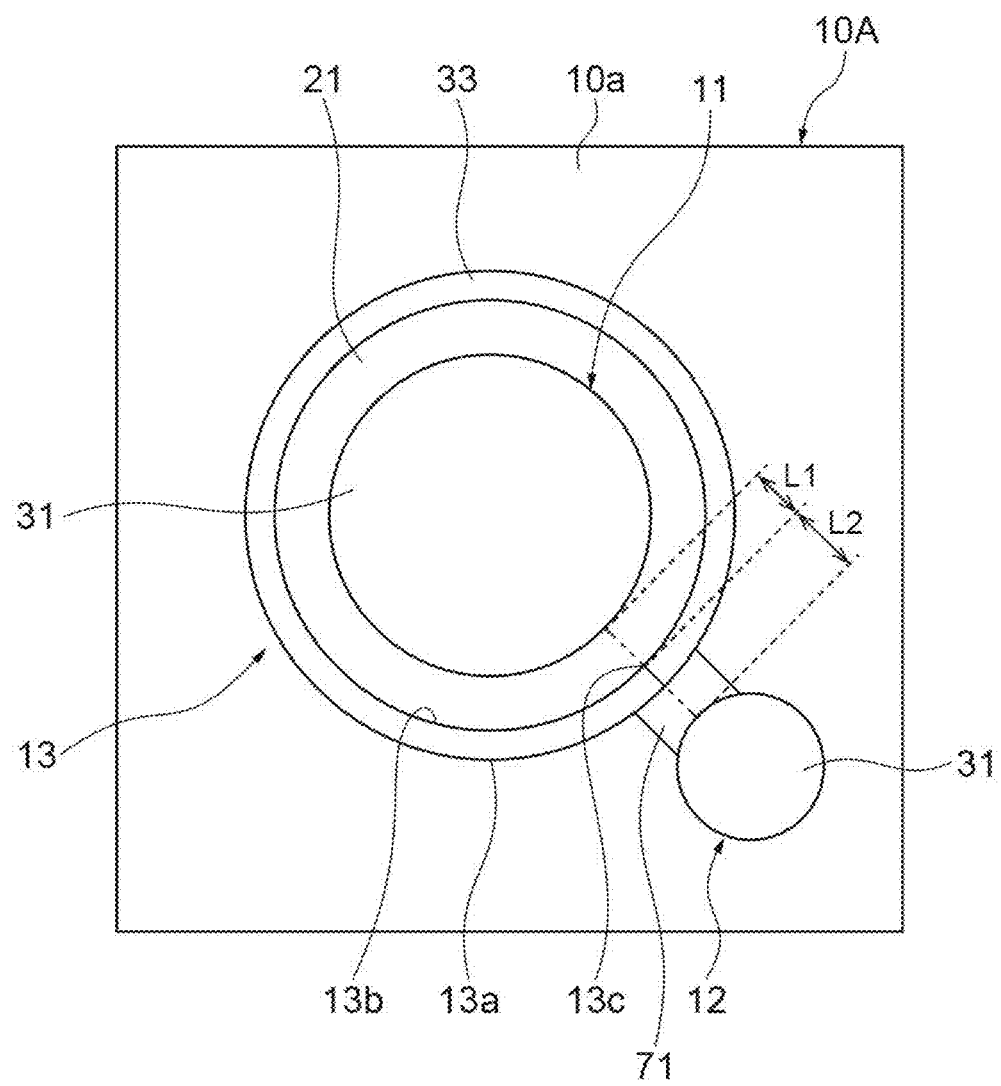
FIG. 6 is a schematic plan view of a semiconductor substrate according to the modification example of the present embodiment.

Next, a light detection device according to a modification example of the present embodiment will be described with reference to FIGS. 5 and 6. FIG. 5 is a schematic cross-sectional view of the light detection device according to the modification example. FIG. 6 is a schematic plan view of a semiconductor substrate illustrated in FIG. 5. This modification example is generally similar to or the same as the above-described embodiment. This modification example is different from the above-described embodiment in that the semiconductor layer 31 of the temperature compensation diode 12 and the semiconductor layer 33 of the peripheral carrier absorbing portion 13 are connected by semiconductor layers of the same conductivity type as the semiconductor layers 31 and 33. Hereinafter, the differences between the above-described embodiment and the modification example will be mainly described.

A semiconductor substrate 10A includes a semiconductor layer 71 that connects the semiconductor layer 31 of the temperature compensation diode 12 and the semiconductor layer 33 of the peripheral carrier absorbing portion 13 to each other. The semiconductor layer 71 has the same conductivity type as the semiconductor layers 31 and 33. In the semiconductor substrate 10A, the semiconductor layer 71 is the same second conductivity type as the semiconductor layers 31 and 33, and is located at the same height as the semiconductor layers 31 and 33 in the thickness direction of the semiconductor substrate 10. The semiconductor layer 71 is, for example, N$^+$ type.

Also in the semiconductor substrate 10A, the semiconductor layer 31 of the APD 11 and the semiconductor layer 31 of the temperature compensation diode 12 have a circular shape when viewed from the direction perpendicular to the main surface 10a. The semiconductor layer 33 of the peripheral carrier absorbing portion 13 has an annular shape when viewed from the direction perpendicular to the main surface 10a, and surrounds the semiconductor layer 31 so as to be spaced apart from the semiconductor layer 31 of the APD 11. A part of the semiconductor layer 33 is located between the semiconductor layer 31 of the APD 11 and the semiconductor layer 31 of the temperature compensation diode 12 when viewed from the direction perpendicular to the main surface 10a. In other words, the peripheral carrier absorbing portion 13 is located between the APD 11 and the temperature compensation diode 12 when viewed from the direction perpendicular to the main surface 10a.

The semiconductor layer 71 connects the edge 13a of the peripheral carrier absorbing portion 13 and the semiconductor layer 33 of the temperature compensation diode 12 to each other between the semiconductor layer 31 of the APD 11 and the semiconductor layer 31 of the temperature compensation diode 12 when viewed from the direction perpendicular to the main surface 10a. In the actual semiconductor substrate 10A, the semiconductor layer 71 and the semiconductor layer 31 of the temperature compensation diode 12 are integrated to the extent that the boundary cannot be recognized. Similarly, the semiconductor layer 71 and the semiconductor layer 33 of the peripheral carrier absorbing portion 13 are integrated to the extent that the boundary cannot be recognized.

Next, light detection devices according to other modification examples of the present embodiment will be described with reference to FIGS. 7 to 10. FIGS. 7 to 10 are schematic plan views of semiconductor substrates of the light detection devices according to the other modification examples. These modification examples are generally similar to or the same as the above-described embodiment. These modification examples are different from the above-described embodiment in that the light detection device includes a semiconductor substrate on which an APD array including a plurality of APDs is formed. Hereinafter, the differences between the above-described embodiment and the modification example will be mainly described.

Figure 7:
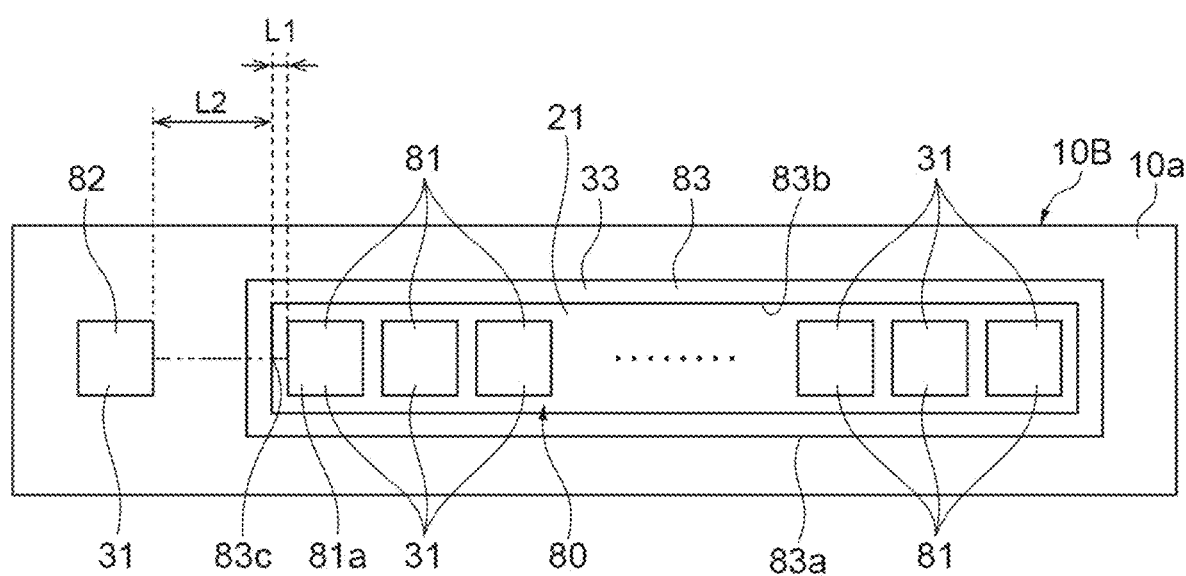
FIG. 7 is a schematic plan view of a semiconductor substrate according to a modification example of the present embodiment.

First, a semiconductor substrate 10B illustrated in FIG. 7 will be described. The semiconductor substrate 10B includes an APD array 80 including a plurality of APDs 81, a temperature compensation diode 82, and a peripheral carrier absorbing portion 83 on the main surface 10a side. The APD array 80 is formed on the semiconductor substrate 10B so as to be spaced apart from the temperature compensation diode 82 and the peripheral carrier absorbing portion 83 when viewed from the direction perpendicular to the main surface 10a. The APDs 81 are formed on the semiconductor substrate 10B so as to be spaced apart from each other when viewed from the direction perpendicular to the main surface 10a.

In the semiconductor substrate 10B, the plurality of APDs 81 and the temperature compensation diodes 82 have rectangular shapes with an equal size, and are arranged in a row in one direction. In the semiconductor substrate 10B, the plurality of APDs 81 are arranged at equal intervals. The temperature compensation diode 82 is located at the end of the array of the plurality of APDs 81 and the temperature compensation diode 82.

The peripheral carrier absorbing portion 83 surrounds the APD array 80 when viewed from the direction perpendicular to the main surface 10a. A part of the peripheral carrier absorbing portion 83 is located between the APD array 80 and the temperature compensation diode 82 when viewed from the direction perpendicular to the main surface 10a. Specifically, a part of the peripheral carrier absorbing portion 83 is located between the temperature compensation diode 82 and an APD 81a closest to the temperature compensation diode 82 among the plurality of APDs 81, when viewed from the direction perpendicular to the main surface 10a.

Each of the APD 81 and the temperature compensation diode 82 includes a semiconductor region 21 and semiconductor layers 31, 32, and 35, similarly to the APD 11 and the temperature compensation diode 12 in the embodiment described above. The peripheral carrier absorbing portion 83 includes the semiconductor region 21 and the semiconductor layers 33 and 35. The semiconductor layer 33 of the peripheral carrier absorbing portion 83 has an annular shape when viewed from the direction perpendicular to the main surface 10a. The peripheral carrier absorbing portion 83 absorbs carriers located at the periphery in the semiconductor layer 33.

The peripheral carrier absorbing portion 83 stands for a portion of the semiconductor substrate 10B surrounded by edges 83a and 83b of the peripheral carrier absorbing layer when viewed from the direction perpendicular to the main surface 10a. In the semiconductor substrate 10B, the edges 83a and 83b are edges of the semiconductor layer 33. The edge 83b is located closer to the APD 81 than the edge 83a.

The APD 81a, the temperature compensation diode 82, and the peripheral carrier absorbing portion 83 have an arrangement relationship similar to that of the APD 11, the temperature compensation diode 12, and the peripheral carrier absorbing portion 13 in the embodiment described above. Specifically, when viewed from the direction perpendicular to the main surface 10a, the distance L1 is smaller than the distance L2 on the line segment connecting the semiconductor layer 31 of the APD 81a and the semiconductor layer 31 of the temperature compensation diode 82 to each other at the shortest distance. In the semiconductor substrate 10B, the distance L1 is the shortest distance between the semiconductor layer 31 of the APD 81a and the peripheral carrier absorbing portion 83 when viewed from the direction perpendicular to the main surface 10a. The distance L2 is the shortest distance between the portion 83c of the peripheral carrier absorbing portion 83 and the semiconductor layer 31 of the temperature compensation diode 82 when viewed from the direction perpendicular to the main surface 10a.

The portion 83c is a portion, which is closest to the APD 81a, of the edges 83a and 83b of the peripheral carrier absorbing portion 83 on the line segment connecting the APD 81a and the temperature compensation diode 82 to each other at the shortest distance. L2/L1 is, for example, more than 1 and 50 or less. L2/L1 may be 20 or more and 50 or less.

Similarly to the semiconductor substrate 10, when viewed from the direction perpendicular to the main surface 10a, the distance L3 is smaller than the distance L4 on the line segment connecting the semiconductor layer 32 of the APD 81a and the semiconductor layer 32 of the temperature compensation diode 82 to each other at the shortest distance. In the semiconductor substrate 10B, the distance L3 is the shortest distance between the semiconductor layer 32 of the APD 81a and the peripheral carrier absorbing portion 83 when viewed from the direction perpendicular to the main surface 10a. The distance L4 is the shortest distance between the portion 83c of the peripheral carrier absorbing portion 83 and the semiconductor layer 32 of the temperature compensation diode 82 when viewed from the direction perpendicular to the main surface 10a.

Figure 8:
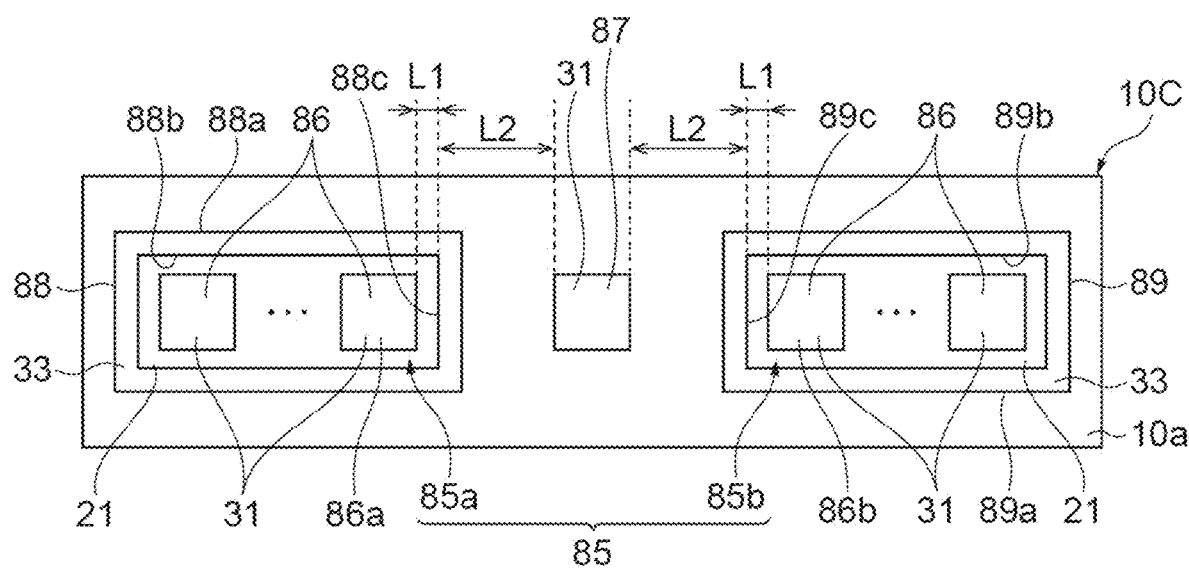
FIG. 8 is a schematic plan view of a semiconductor substrate according to a modification example of the present embodiment.

Next, a semiconductor substrate 10C illustrated in FIG. 8 will be described. The semiconductor substrate 10C includes an APD array 85 including a plurality of APDs 86, a temperature compensation diode 87, and peripheral carrier absorbing portions 88 and 89 on the main surface 10*a* side. The APD array 85 is formed on the semiconductor substrate 10C so as to be spaced apart from the temperature compensation diode 87 and the peripheral carrier absorbing portions 88 and 89 when viewed from the direction perpendicular to the main surface 10*a*. Each APD 86 is formed on the semiconductor substrate 10C so as to be spaced apart from each other when viewed from the direction perpendicular to the main surface 10*a*.

In the semiconductor substrate 10C, the plurality of APDs 86 and the temperature compensation diode 87 have rectangular shapes with an equal size, and are arranged in a row in one direction. In the semiconductor substrate 10C, the plurality of APDs 86 are arranged in two groups. The temperature compensation diode 87 is disposed between the two groups when viewed from the direction perpendicular to the main surface 10*a*. In other words, the temperature compensation diode 87 is interposed between two APD arrays 85*a* and 85*b* in which a plurality of APDs 86 are arranged. In each of the APD array 85*a* and the APD array 85*b*, a plurality of APDs 86 are arranged at equal intervals. The APD array 85*a* and the APD array 85*b* are arranged line-symmetrically with respect to a straight line passing through the temperature compensation diode 87 in a direction parallel to the main surface 10*a* and perpendicular to the arrangement direction of the plurality of APDs 86.

The peripheral carrier absorbing portions 88 and 89 surround the plurality of APDs 86 for each of the above-described groups when viewed from the direction perpendicular to the main surface 10*a*. In other words, the peripheral carrier absorbing portion 88 surrounds the APD array 85*a*. The peripheral carrier absorbing portion 89 surrounds the APD array 85*b*. The peripheral carrier absorbing portion 88 and the peripheral carrier absorbing portion 89 are arranged line-symmetrically with respect to a straight line passing through the temperature compensation diode 87 in a direction parallel to the main surface 10*a* and perpendicular to the arrangement direction of the plurality of APDs 86. Each of the peripheral carrier absorbing portions 88 and 89 includes an annular semiconductor layer 33 when viewed from the direction perpendicular to the main surface 10*a*.

A part of the peripheral carrier absorbing portion 88 is located between the APD array 85*a* and the temperature compensation diode 87 when viewed from the direction perpendicular to the main surface 10*a*. Specifically, a part of the peripheral carrier absorbing portion 88 is located between the temperature compensation diode 87 and an APD 86*a* closest to the temperature compensation diode 87 among the plurality of APDs 86 included in the APD array 85*a*, when viewed from the direction perpendicular to the main surface 10*a*. A part of the peripheral carrier absorbing portion 89 is located between the APD array 85*b* and the temperature compensation diode 87 when viewed from the direction perpendicular to the main surface 10*a*. Specifically, a part of the peripheral carrier absorbing portion 89 is located between the temperature compensation diode 87 and an APD 86*b* closest to the temperature compensation diode 87 among the plurality of APDs 86 included in the APD array 85*b*, when viewed from the direction perpendicular to the main surface 10*a*.

Each of the APD 86 and the temperature compensation diode 87 includes a semiconductor region 21 and semiconductor layers 31, 32, and 35, similarly to the APD 11 and the temperature compensation diode 12 in the embodiment described above. Each of the peripheral carrier absorbing portions 88 and 89 includes the semiconductor region 21 and the semiconductor layers 33 and 35. The semiconductor layer 33 of each of the peripheral carrier absorbing portions 88 and 89 has an annular shape when viewed from the direction perpendicular to the main surface 10*a*. Each of the peripheral carrier absorbing portions 88 and 89 absorbs carriers located at the periphery in the semiconductor layer 33.

In the semiconductor substrate 10C, the peripheral carrier absorbing portion 88 stands for a portion of the semiconductor substrate 10C surrounded by edges 88*a* and 88*b* of the peripheral carrier absorbing layer when viewed from the direction perpendicular to the main surface 10*a*. The peripheral carrier absorbing portion 89 means a portion of the semiconductor substrate 10C surrounded by edges 89*a* and 89*b* of the peripheral carrier absorbing layer when viewed from the direction perpendicular to the main surface 10*a*. In the semiconductor substrate 10C, the edges 88*a*, 88*b*, 89*a*, 89*b* are the edges of the semiconductor layer 33. The edge 88*b* is located closer to the APD 86 than the edge 88*a*. The edge 89*b* is located closer to the APD 86 than the edge 89*a*.

The APD 86*a*, the temperature compensation diode 87, and the peripheral carrier absorbing portion 88 have an arrangement relationship similar to that of the APD 11, the temperature compensation diode 12, and the peripheral carrier absorbing portion 13 in the embodiment described above. The APD 86*b*, the temperature compensation diode 87, and the peripheral carrier absorbing portion 89 have an arrangement relationship similar to that of the APD 11, the temperature compensation diode 12, and the peripheral carrier absorbing portion 13.

For example, when viewed from the direction perpendicular to the main surface 10*a*, the distance L1 is smaller than the distance L2 on the line segment connecting the semiconductor layer 31 of each of the APDs 86*a* and 86*b* and the semiconductor layer 31 of the temperature compensation diode 87 to each other at the shortest distance. In the semiconductor substrate 10C, when viewed from the direction perpendicular to the main surface 10*a*, the distance L1 is the shortest distance between the semiconductor layer 31 of the APD 86*a* and the peripheral carrier absorbing portion 88 and is the shortest distance between the semiconductor layer 31 of the APD 86*a* and the peripheral carrier absorbing portion 89. When viewed from the direction perpendicular to the main surface 10*a*, the distance L2 is the shortest distance between a portion 88*c* of the peripheral carrier absorbing portion 88 and the semiconductor layer 31 of the temperature compensation diode 87 and is the shortest distance between a portion 89*c* of the peripheral carrier absorbing portion 89 and the semiconductor layer 31 of the temperature compensation diode 87.

The portion 88*c* is a portion, which is closest to the APD 86*a*, of the edges 88*a* and 88*b* of the peripheral carrier absorbing portion 88 on the line segment connecting the APD 86*a* and the temperature compensation diode 87 to each other at the shortest distance. The portion 89*c* is a portion, which is closest to the APD 86*b*, of the edges 89*a* and 89*b* of the peripheral carrier absorbing portion 89 on the line segment connecting the APD 86*b* and the temperature compensation diode 87 to each other at the shortest distance. L2/L1 is, for example, more than 1 and 50 or less. L2/L1 may be 20 or more and 50 or less.

Figure 9:
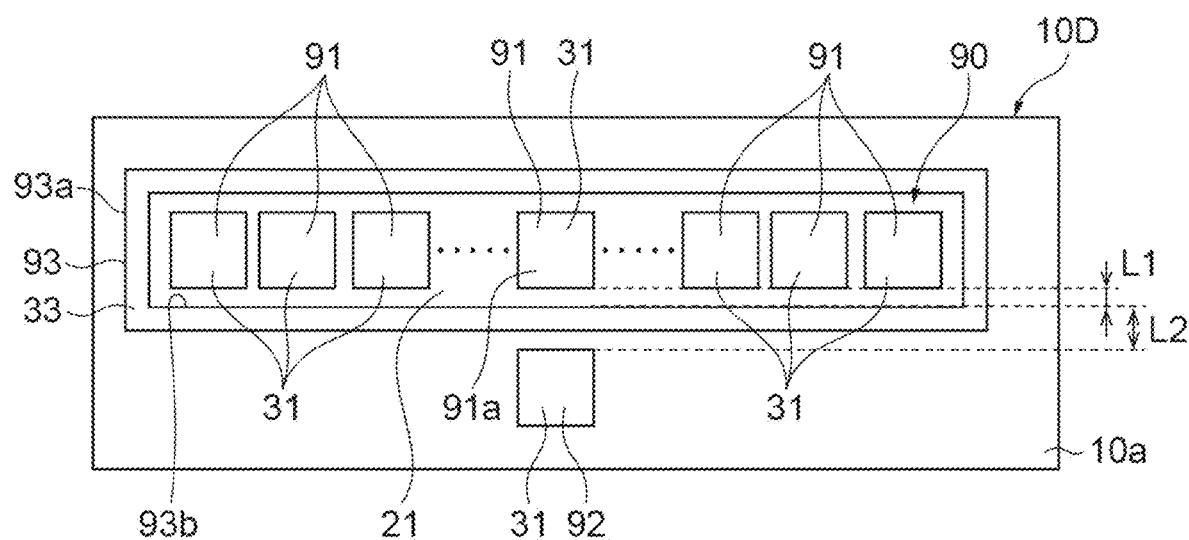
FIG. 9 is a schematic plan view of a semiconductor substrate according to a modification example of the present embodiment.

Next, a semiconductor substrate 10D illustrated in FIG. 9 will be described. The semiconductor substrate 10D includes an APD array 90 including a plurality of APDs 91, a temperature compensation diode 92, and a peripheral carrier absorbing portion 93 on the main surface 10*a* side.

The APD array 90 is formed on the semiconductor substrate 10D so as to be spaced apart from the temperature compensation diode 92 and the peripheral carrier absorbing portion 93 when viewed from the direction perpendicular to the main surface 10a. Each APD 91 is formed on the semiconductor substrate 10D so as to be spaced apart from each other when viewed from the direction perpendicular to the main surface 10a.

In the semiconductor substrate 10D, the plurality of APDs 91 have rectangular shapes with an equal size, and are arranged in a row in one direction. In the semiconductor substrate 10D, the plurality of APDs 91 are arranged at equal intervals. The temperature compensation diode 92 and the APD array 90 are arranged in a direction perpendicular to the direction, in which the plurality of APDs 91 are arranged, and parallel to the main surface 10a.

The peripheral carrier absorbing portion 93 surrounds the APD array 90 when viewed from the direction perpendicular to the main surface 10a. A part of the peripheral carrier absorbing portion 93 is located between the APD array 90 and the temperature compensation diode 92 when viewed from the direction perpendicular to the main surface 10a. Specifically, a part of the peripheral carrier absorbing portion 93 is located between the temperature compensation diode 92 and an APD 91a closest to the temperature compensation diode 92 among the plurality of APDs 91, when viewed from the direction perpendicular to the main surface 10a. The APD 91a is an APD located at the center of the APD array 90 among the plurality of APDs 91.

Each of the APD 91 and the temperature compensation diode 92 includes a semiconductor region 21 and semiconductor layers 31, 32, and 35, similarly to the APD 11 and the temperature compensation diode 12 in the embodiment described above. The peripheral carrier absorbing portion 93 includes the semiconductor region 21 and the semiconductor layers 33 and 35. The semiconductor layer 33 of the peripheral carrier absorbing portion 93 has an annular shape when viewed from the direction perpendicular to the main surface 10a. The peripheral carrier absorbing portion 93 absorbs carriers located at the periphery in the semiconductor layer 33.

The peripheral carrier absorbing portion 93 means a portion of the semiconductor substrate 10D surrounded by edges 93a and 93b of the peripheral carrier absorbing layer when viewed from the direction perpendicular to the main surface 10a. The edges 93a and 93b are edges of the semiconductor layer 33. The edge 93b is located closer to the APD 91 than the edge 93a. The APD 91a, the temperature compensation diode 92, and the peripheral carrier absorbing portion 93 have an arrangement relationship similar to that of the APD 11, the temperature compensation diode 12, and the peripheral carrier absorbing portion 13 in the embodiment described above.

Figure 10:
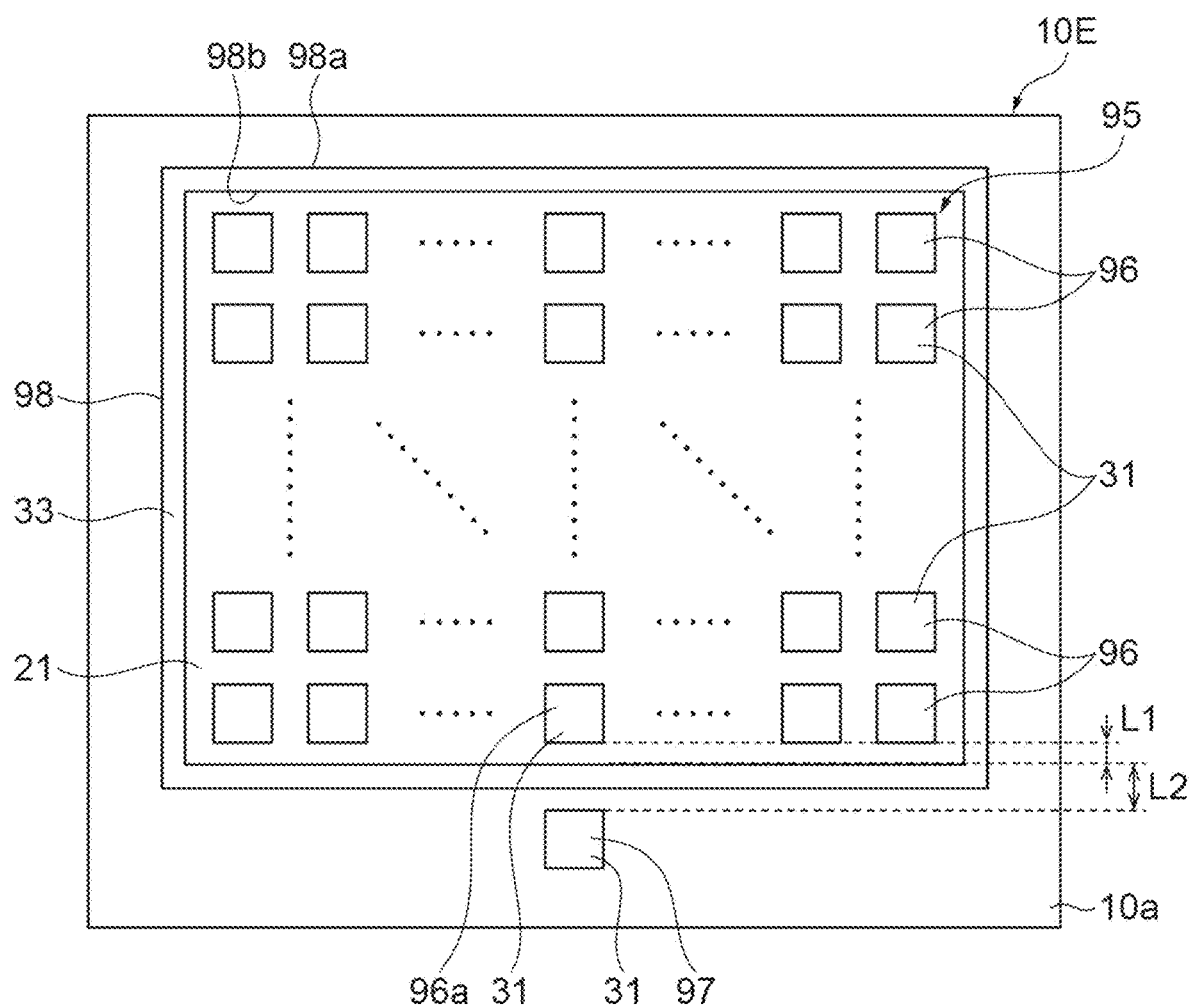
FIG. 10 is a schematic plan view of a semiconductor substrate according to a modification example of the present embodiment.

Next, a semiconductor substrate 10E illustrated in FIG. 10 will be described. The semiconductor substrate 10E includes an APD array 95 including a plurality of APDs 96, a temperature compensation diode 97, and a peripheral carrier absorbing portion 98 on the main surface 10a side. The APD array 95 is formed on the semiconductor substrate 10E so as to be spaced apart from the temperature compensation diode 97 and the peripheral carrier absorbing portion 98 when viewed from the direction perpendicular to the main surface 10a. Each APD 96 is formed on the semiconductor substrate 10E so as to be spaced apart from each other when viewed from the direction perpendicular to the main surface 10a.

In the semiconductor substrate 10E, the plurality of APDs 96 have rectangular shapes with an equal size, and are two-dimensionally arranged in a matrix. In the semiconductor substrate 10E, the plurality of APDs 96 are arranged at equal intervals. The temperature compensation diode 97 and the APD array 95 are arranged in the column direction of the plurality of APDs 96.

The peripheral carrier absorbing portion 98 surrounds the APD array 95 when viewed from the direction perpendicular to the main surface 10a. A part of the peripheral carrier absorbing portion 98 is located between the APD array 95 and the temperature compensation diode 97 when viewed from the direction perpendicular to the main surface 10a. Specifically, a part of the peripheral carrier absorbing portion 98 is located between the temperature compensation diode 97 and an APD 96a closest to the temperature compensation diode 97 among the plurality of APDs 96, when viewed from the direction perpendicular to the main surface 10a. The APD 96a is an APD located at the center of the row closest to the temperature compensation diode 97 among the plurality of APDs 96.

Each of the APD 96 and the temperature compensation diode 97 includes a semiconductor region 21 and semiconductor layers 31, 32, and 35, similarly to the APD 11 and the temperature compensation diode 12 in the embodiment described above. The peripheral carrier absorbing portion 98 includes the semiconductor region 21 and the semiconductor layers 33 and 35. The peripheral carrier absorbing portion 98 absorbs carriers located at the periphery in the semiconductor layer 33.

The peripheral carrier absorbing portion 98 means a portion of the semiconductor substrate 10E surrounded by edges 98a and 98b of the peripheral carrier absorbing layer when viewed from the direction perpendicular to the main surface 10a. The edges 98a and 98b are edges of the semiconductor layer 33. The edge 98b is located closer to the APD 96 than the edge 98a. The APD 96a, the temperature compensation diode 97, and the peripheral carrier absorbing portion 98 have the arrangement relationship similar to that of the APD 11, the temperature compensation diode 12, and the peripheral carrier absorbing portion 13 in the embodiment described above.

Figure 11:
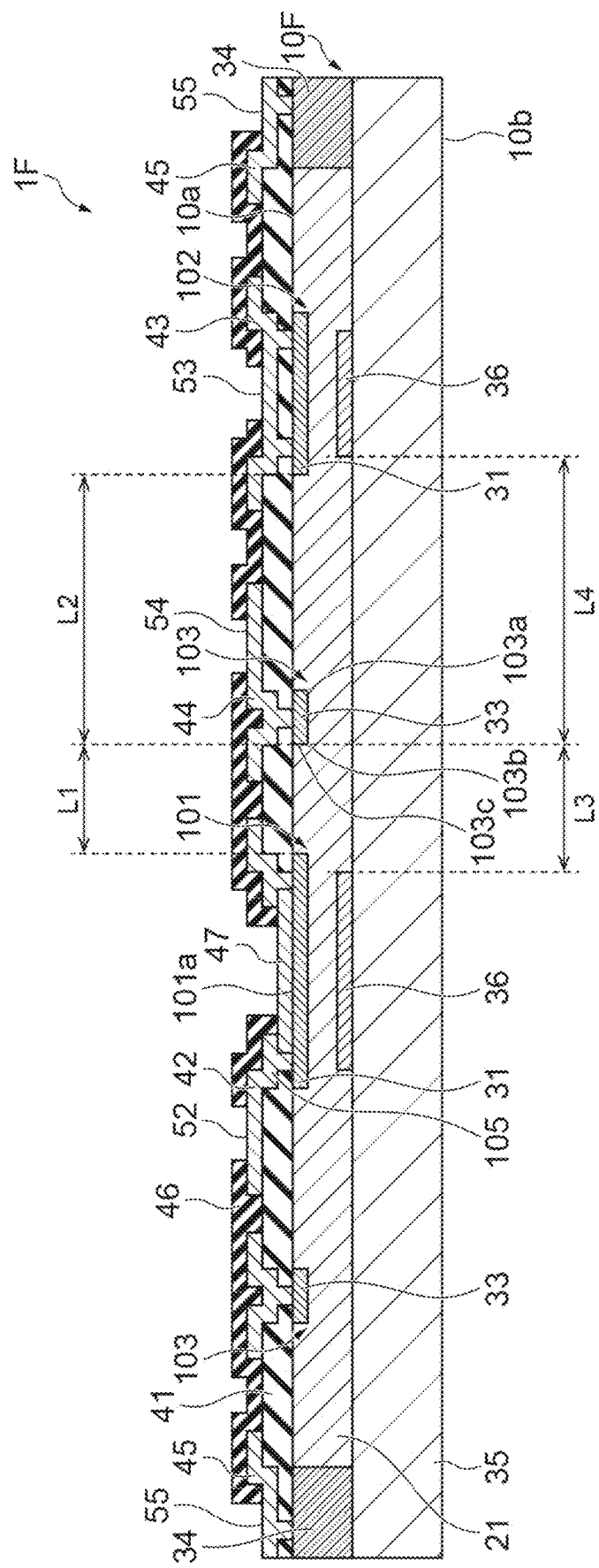
FIG. 11 is a schematic plan view of a semiconductor substrate according to a modification example of the present embodiment.

Next, a light detection device according to another modification example of the present embodiment will be described with reference to FIG. 11. FIG. 11 is a schematic cross-sectional view of the light detection device according to the modification example. This modification example is generally similar to or the same as the above-described embodiment. This modification example is different from the above-described embodiment in that a so-called reverse type APD is formed on the semiconductor substrate of the light detection device and that the APD on the semiconductor substrate is arranged to operate in Geiger mode. The semiconductor substrate 10 illustrated in FIG. 1 has a so-called reach-through type APD, and the APD operates in the linear mode. On the other hand, a semiconductor substrate 10F of a light detection device 1F according to this modification example has a so-called reverse type APD, and the APD is arranged to operate in Geiger mode. Hereinafter, the differences between the above-described embodiment and the modification example will be mainly described.

The semiconductor substrate 10F includes an APD 101, a temperature compensation diode 102, and a peripheral carrier absorbing portion 103 respectively corresponding to the APD 11, the temperature compensation diode 12, and the peripheral carrier absorbing portion 13 of the semiconductor substrate 10. The APD 101 has a light incidence surface 101a corresponding to the light incidence surface 11a of the APD 11 on the main surface 10a side. The semiconductor substrate 10F includes a semiconductor region 21 and semiconductor layers 31, 33, 34, 35, and 36. The semiconductor substrate 10F is different from the semiconductor substrate 10 in that the semiconductor layer 36 is provided instead of the semiconductor layer 32. Each of the APD 101 and the temperature compensation diode 102 includes the semiconductor region 21 and the semiconductor layers 31, 35, and 36. As illustrated in FIG. 11, the semiconductor layer 34 is in contact with the semiconductor layer 35.

The peripheral carrier absorbing portion 103 includes the semiconductor region 21 and the semiconductor layers 33 and 35. The peripheral carrier absorbing portion 103 absorbs carriers located at the periphery in the semiconductor layer 33. That is, the semiconductor layer 33 functions as a peripheral carrier absorbing layer that absorbs peripheral carriers. In this modification example, the peripheral carrier absorbing portion 103 is a portion of the semiconductor substrate 10F surrounded by edges 103a and 103b of the peripheral carrier absorbing layer when viewed from the direction perpendicular to the main surface 10a. In the present embodiment, the edges 103a and 103b are edges of the semiconductor layer 33. The edge 103b is located closer to the APD 101 than the edge 103a.

In the semiconductor substrate 10F, the semiconductor layer 36 is located between the semiconductor region 21 and the semiconductor layer 35. In other words, the semiconductor layer 36 is in contact with the semiconductor region 21 on the main surface 10a side and is in contact with the semiconductor layer 35 on the main surface 10b side. In this modification example, the impurity concentration of the semiconductor layer 36 of the temperature compensation diode 102 is lower than the impurity concentration of the semiconductor layer 36 of the APD 101.

In the semiconductor substrate 10F, the semiconductor region 21 and the semiconductor layers 31, 33, and 36 are the first conductivity type, and the semiconductor layers 34, and 35 are the second conductivity type. Also in this modification example, the first conductivity type is P type and the second conductivity type is N type. When the semiconductor substrate 10F is an Si-based substrate, a Group 13 element such as B is used as the P-type impurity, and a Group 15 element such as N, P, or As is used as the N-type impurity.

In the semiconductor substrate 10F, the semiconductor layers 31 and 33 have a higher impurity concentration than the semiconductor region 21. The semiconductor layer 36 has a higher impurity concentration than the semiconductor region 21, and has a lower impurity concentration than the semiconductor layers 31 and 33. Specifically, the semiconductor region 21 is, for example, $P^-$ type, the semiconductor layers 31 and 33 are, for example, $P^+$ type, and the semiconductor layer 36 is, for example, P type. In this modification example, the semiconductor layer 31 forms an anode in each of the APD 101 and the temperature compensation diode 102.

In the semiconductor substrate 10F, the semiconductor layer 34 has the same impurity concentration as the semiconductor layer 35. The semiconductor layers 34 and 35 are, for example, $N^+$ type. The semiconductor layers 34 and 35 form the cathode of the light detection device 1F. The semiconductor layers 34 and 35 form, for example, cathodes of the APD 101, the temperature compensation diode 102, and the peripheral carrier absorbing portion 103.

In this modification example, a quenching resistor 105 is provided in a part of the electrode 42. The quenching resistor 105 is electrically connected to the semiconductor layer 31 of the $P^+$ type in the APD 101. The quenching resistor 105 is electrically connected to the pad electrode 52 on a side opposite to the semiconductor layer 31. In this modification example, the pad electrode 52 is a pad electrode for the anode of the APD 101. The pad electrode 53 is a pad electrode for the anode of the temperature compensation diode 102. The pad electrode 54 is a pad electrode for the anode of the peripheral carrier absorbing portion 103. The pad electrode 55 is a pad electrode for the cathodes of the APD 101, the temperature compensation diode 102, and the peripheral carrier absorbing portion 103.

The APD 101, the temperature compensation diode 102, and the peripheral carrier absorbing portion 103 are connected to the pad electrode 55 in parallel with each other. When a reverse bias is applied to the APD 101, the temperature compensation diode 102, and the peripheral carrier absorbing portion 103, a positive voltage is applied to the pad electrode for the anode, and a negative voltage is applied to the pad electrode for the cathode.

When viewed from the direction perpendicular to the main surface 10a, on the line segment connecting the APD 101 and the temperature compensation diode 102 to each other at the shortest distance, the shortest distance between the APD 101 and the peripheral carrier absorbing portion 103 is smaller than the shortest distance between a portion 103c of the peripheral carrier absorbing portion 103 and the temperature compensation diode 102. The portion 103c is a portion, which is closest to the APD 101, of the edges 103a and 103b of the peripheral carrier absorbing portion 103 on the line segment connecting the APD 101 and the temperature compensation diode 102 to each other at the shortest distance. In other words, the portion 103c is a portion, which is closest to the temperature compensation diode 102, of the edge 103b of the peripheral carrier absorbing portion 103 when viewed from the direction perpendicular to the main surface 10a.

More specifically, when viewed from the direction perpendicular to the main surface 10a, the distance L1 is smaller than the distance L2 on the line segment connecting the semiconductor layer 31 of the APD 101 and the semiconductor layer 31 of the temperature compensation diode 102 to each other at the shortest distance. The distance L1 is the shortest distance between the semiconductor layer 31 of the APD 101 and the peripheral carrier absorbing portion 103 when viewed from the direction perpendicular to the main surface 10a. The distance L2 is the shortest distance between the portion 103c of the peripheral carrier absorbing portion 103 and the semiconductor layer 31 of the temperature compensation diode 92 when viewed from the direction perpendicular to the main surface 10a. L2/L1 is, for example, more than 1 and 50 or less. L2/L1 may be 20 or more and 50 or less.

As illustrated in FIG. 11, when viewed from the direction perpendicular to the main surface 10a, the distance L3 is smaller than the distance L4 on the line segment connecting the semiconductor layer 36 of the APD 101 and the semiconductor layer 36 of the temperature compensation diode 102 to each other at the shortest distance. The distance L3 is the shortest distance between the semiconductor layer 36 of the APD 101 and the peripheral carrier absorbing portion 103 when viewed from the direction perpendicular to the main surface 10a. The distance L4 is the shortest distance between the portion 103c of the peripheral carrier absorbing portion 103 and the semiconductor layer 36 of the temperature compensation diode 102 when viewed from the direction perpendicular to the main surface 10a.

Figure 12:
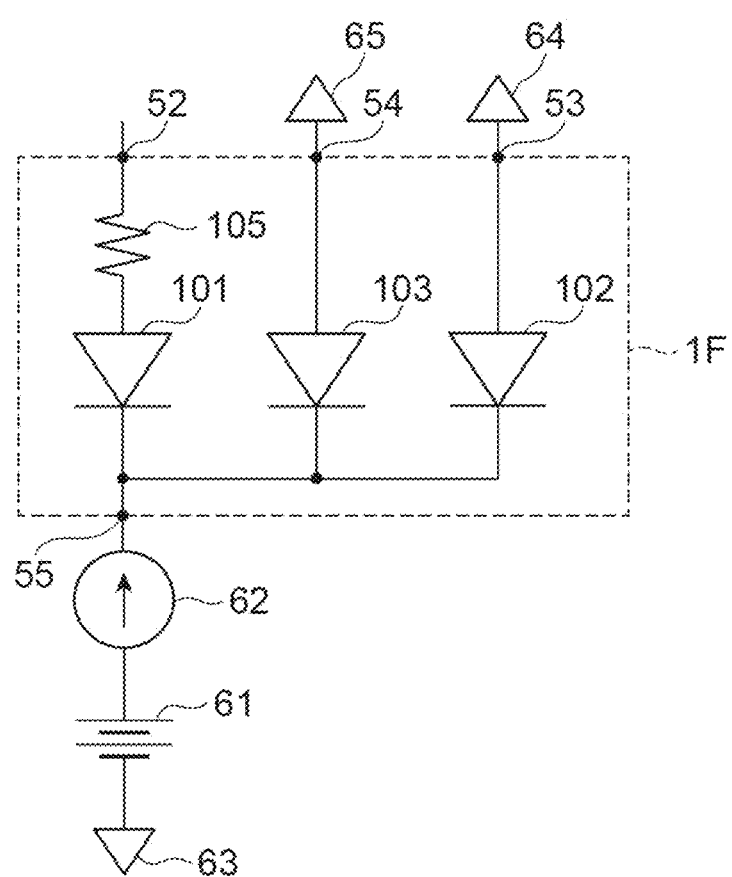
FIG. 12 is a diagram for describing the circuit configuration of the light detection device according to the modification example of the present embodiment.

Next, the operation of a light detection device including the semiconductor substrate 10F will be described with reference to FIG. 12. Similarly to the light detection device 1, the light detection device 1F is used in a state in which the power supply 61 and the current limiting circuit 62 are connected to the pad electrode 55. In the light detection device 1F, the negative electrode side of the power supply 61 is connected to the ground 63, and the positive electrode side of the power supply 61 is connected to the pad electrode 55 through the current limiting circuit 62. The pad electrodes 53 and 54 are connected to the grounds 64 and 65, respectively. The grounds 64 and 65 may be connected to each other. The pad electrode 52 is connected to a signal reading circuit (not illustrated).

In this modification example, the pad electrode 55 is connected to the semiconductor layer 34 of the N+ type, and the semiconductor layer 34 is connected to the semiconductor layer 35 of the N$^+$ type. Therefore, the cathodes of the APD 101, the temperature compensation diode 102, and the peripheral carrier absorbing portion 103 are connected to the pad electrode 55 in parallel with each other. As a result, a positive potential is applied to the cathodes of the APD 101, the temperature compensation diode 102, and the peripheral carrier absorbing portion 103 by the power supply 61.

The difference between the potential applied to the pad electrode 53 and the potential applied to the pad electrode 55 is a breakdown voltage of the temperature compensation diode 102. Therefore, a potential corresponding to the breakdown voltage applied to the temperature compensation diode 102 is applied to the cathode of the APD 101. As a result, a voltage corresponding to the breakdown voltage applied to the temperature compensation diode 102 is applied to the APD 101 as a bias voltage. Similarly, a voltage corresponding to the breakdown voltage applied to the temperature compensation diode 102 is applied to the cathode of the peripheral carrier absorbing portion 103 as a bias voltage.

In this modification example, since a combination of the power supply 61 and the current limiting circuit 62 is connected to the pad electrode 55, the breakdown voltage of the temperature compensation diode 102 is applied to the pad electrode 55. Therefore, the breakdown voltage of the temperature compensation diode 102 is applied to the APD 101 and the peripheral carrier absorbing portion 103 as a bias voltage. In this modification example, the output voltage of the power supply 61 is equal to or higher than the operating voltage of the APD 101. In other words, the output voltage of the power supply 61 is equal to or higher than the upper limit of the temperature fluctuation of the breakdown voltage of the temperature compensation diode 102. For example, the output voltage of the power supply 61 is 300 V or higher. The current limiting circuit 62 is configured to include, for example, a current mirror circuit or a resistor. In this case, for example, the multiplication factor of the APD 101 can be arbitrarily set according to the breakdown voltage difference between the temperature compensation diode 102 and the APD 101. When the amplification factor of the APD 101 is set to the optimal multiplication factor Mopt having a high S/N ratio, the detection accuracy can be improved.

In this modification example, the cathodes of the APD 101, the temperature compensation diode 102, and the peripheral carrier absorbing portion 103 are integrally formed in the semiconductor layer 35. For example, when the potential applied to the pad electrode 53 is 0 V and the breakdown voltage of the temperature compensation diode 12 is 50 V under an ambient temperature of 25° C., a potential of +50 V is applied to the cathode of the APD 101 and the cathode of the peripheral carrier absorbing portion 13. When the breakdown voltage of the APD 101 is 48 V under an ambient temperature of 25° C., the APD 101 operates in a state in which the potential difference between the anode and the cathode is higher by 2 V than the breakdown voltage.

The APD 101 and the temperature compensation diode 102 have the same temperature characteristics with respect to the relationship between the amplification factor and the bias voltage. Therefore, as long as the temperature compensation diode 102 is in a breakdown state, the APD 101 operates while maintaining the amplification factor when a bias voltage higher by 2 V than the breakdown voltage is applied under an ambient temperature of 25° C. In other words, in the light detection device 1F, since a voltage that causes the temperature compensation diode 102 to break down is applied to the temperature compensation diode 102, temperature compensation is provided for the amplification factor of the APD 101.

In this modification example, the configuration in which the so-called reverse type APD 101 is arranged to operate in Geiger mode has been described. The light detection device 1F may have a configuration in which the reverse type APD 101 operates in the linear mode. In the configuration in which the APD 101 operates in the linear mode, the quenching resistor 105 is not required. The semiconductor substrate 10F is configured such that the impurity concentration of the semiconductor layer 36 of the temperature compensation diode 102 is higher than the impurity concentration of the semiconductor layer 36 of the APD 101.

Next, the operational effects of the light detection devices in the above-described embodiment and modification examples will be described. The light detection device 1 is used for various applications. Therefore, it is expected to ensure the detection accuracy of the light detection device 1 in an environment corresponding to each application. For example, when the light detection device 1 is used in an in-vehicle application, it is expected to ensure the detection accuracy in a high temperature environment of 100° C. or higher. However, in such a high temperature environment, carriers due to heat are generated in the semiconductor substrate 10 forming the APD 11. For this reason, when the generated carriers reach the APD 11, photon shot noise occurs in the detection result of the APD 11.

In the semiconductor substrates 10 and 10A of the light detection device 1, the peripheral carrier absorbing portion 13 surrounds the APD 11 when viewed from the direction perpendicular to the main surface 10a. Therefore, the carriers generated in the semiconductor substrates 10 and 10A in a high temperature environment are suppressed from reaching the APD 11, enabling improvement of the detection accuracy. In the semiconductor substrate 10F, the peripheral carrier absorbing portion 103 surrounds the APD 101 when viewed from the direction perpendicular to the main surface 10a. Therefore, the carriers generated in the semiconductor substrate 10F in a high temperature environment are suppressed from reaching the APD 101, enabling improvement of the detection accuracy.

In the semiconductor substrate 10B, the peripheral carrier absorbing portion 83 surrounds the APD array 80 when viewed from the direction perpendicular to the main surface 10a. In the semiconductor substrate 10C, when viewed from the direction perpendicular to the main surface 10a, the peripheral carrier absorbing portion 88 surrounds the APD array 85a and the peripheral carrier absorbing portion 89 surrounds the APD array 85b. In the semiconductor substrate 10D, the peripheral carrier absorbing portion 93 surrounds the APD array 90 when viewed from the direction perpendicular to the main surface 10a. In the semiconductor substrate 10E, the peripheral carrier absorbing portion 98 surrounds the APD array 95 when viewed from the direction perpendicular to the main surface 10a. Therefore, the carriers generated in the semiconductor substrates 10B, 10C, 10D, and 10E in a high temperature environment are suppressed from reaching the APD arrays 80, 85a, 85b, 90, and 95, enabling improvement of the detection accuracy.

Conventionally, when manufacturing a light detection device including an APD and a temperature compensation diode having the same temperature characteristics, it has been necessary to select and combine APDs having desired temperature characteristics with respect to the relationship between the amplification factor and the bias voltage. For this reason, it has been difficult to reduce the cost. In this regard, in the light detection devices 1 and 1F, the APDs 11, 81, 86, 91, 96, and 101 and the temperature compensation diodes 12, 82, 87, 92, 97, and 102 are formed on the same semiconductor substrates 10, 10A, 10B, 10C, 10D, 10E, and 10F, respectively. In this case, the temperature compensation diodes 12, 82, 87, 92, 97, and 102 and the APDs 11, 81, 86, 91, 96, and 101 having the same temperature characteristics over a wide temperature range with respect to the amplification factor and the bias voltage are formed more easily and accurately than in a case where the temperature compensation diodes 12, 82, 87, 92, 97, and 102 and the APDs 11, 81, 86, 91, 96, and 101 are formed on different semiconductor substrates. Therefore, temperature compensation can be ensured for the multiplication factor while suppressing the manufacturing cost.

When a breakdown voltage is applied to the temperature compensation diodes 12, 82, 87, 92, 97, and 102, the temperature compensation diodes 12, 82, 87, 92, 97, and 102 may emit light. When the temperature compensation diodes 12, 82, 87, 92, 97, and 102 emit light, carriers are generated in the semiconductor substrate due to the light emitted from the temperature compensation diodes 12, 82, 87, 92, 97, and 102. Therefore, in a state in which the temperature compensation diodes 12, 82, 87, 92, 97, and 102 and the APDs 11, 81, 86, 91, 96, and 101 are formed on the same semiconductor substrate, the carriers may affect the detection results of the APDs 11, 81, 86, 91, 96, and 101.

In the semiconductor substrates 10 and 10A of the light detection device 1, the peripheral carrier absorbing portion 13 is located between the APD 11 and the temperature compensation diode 12. When viewed from the direction perpendicular to the main surface 10a, on the line segment connecting the APD 11 and the temperature compensation diode 12 to each other at the shortest distance, the shortest distance between the APD 11 and the peripheral carrier absorbing portion 13 is smaller than the shortest distance between a portion 13c of the peripheral carrier absorbing portion 13 and the temperature compensation diode 12.

Similarly, in the semiconductor substrate 10B, the peripheral carrier absorbing portion 83 is located between the APD array 80 and the temperature compensation diode 82. In the semiconductor substrate 10C, the peripheral carrier absorbing portion 88 is located between the APD array 85a and the temperature compensation diode 87, and the peripheral carrier absorbing portion 89 is located between the APD array 85b and the temperature compensation diode 87. In the semiconductor substrate 10D, the peripheral carrier absorbing portion 93 is located between the APD array 90 and the temperature compensation diode 92. In the semiconductor substrate 10E, the peripheral carrier absorbing portion 98 is located between the APD array 95 and the temperature compensation diode 97. In the semiconductor substrate 10F, the peripheral carrier absorbing portion 103 is located between the APD 101 and the temperature compensation diode 102.

For example, when viewed from the direction perpendicular to the main surface 10a, on the line segment connecting the APD 11 and the temperature compensation diode 12 to each other at the shortest distance, the distance L1 between the semiconductor layer 31 of the APD 11 and the peripheral carrier absorbing portions 13 is smaller than the distance L2 between the portion 13c of the peripheral carrier absorbing portion 13 and the semiconductor layer 31 of the temperature compensation diode 12. When viewed from the direction perpendicular to the main surface 10a, on the line segment connecting the APD 11 and the temperature compensation diode 12 to each other at the shortest distance, the distance L3 between the semiconductor layer 32 of the APD 11 and the peripheral carrier absorbing portions 13 is smaller than the distance L4 between the portion 13c of the peripheral carrier absorbing portion 13 and the semiconductor layer 32 of the temperature compensation diode 12. In the semiconductor substrate 10F of the light detection device 1F, when viewed from the direction perpendicular to the main surface 10a, on the line segment connecting the APD 101 and the temperature compensation diode 102 to each other at the shortest distance, the distance L3 between the semiconductor layer 36 of the APD 101 and the peripheral carrier absorbing portions 103 is smaller than the distance L4 between the portion 103c of the peripheral carrier absorbing portion 103 and the semiconductor layer 36 of the temperature compensation diode 102.

In these configurations, the carriers generated due to the light emission of the temperature compensation diodes 12, 82, 87, 92, 97, and 102 are absorbed at the peripheral carrier absorbing portions 13, 83, 88, 89, 93, 98, and 103 before reaching the APDs 11, 81, 86, 91, 96, and 101. As a result, the carriers due to the temperature compensation diodes 12, 82, 87, 92, 97, and 102 are suppressed from reaching the APDs 11, 81, 86, 91, 96, and 101, enabling improvement of the detection accuracy. Therefore, in the light detection devices 1 and 1F, temperature compensation is ensured for the multiplication factor while suppressing the manufacturing cost, enabling improvement of the detection accuracy. L2/L1 is, for example, more than 1 and 50 or less. L2/L1 may be 20 or more and 50 or less, and in this case, the carriers due to the temperature compensation diodes 12, 82, 87, 92, 97, and 102 are further suppressed from reaching the APDs 11, 81, 86, 91, 96, and 101.

The light detection devices 1 and 1F include the electrodes 42, 43, 44, and 45. As illustrated in FIGS. 1 and 11, for example, the electrode 42 is connected to the APDs 11 and 101 and is configured to output signals from the APDs 11 and 101. The electrode 43 is connected to the temperature compensation diodes 12 and 102, and the electrode 44 is connected to the peripheral carrier absorbing portions 13 and 103. In this case, a desired potential can be applied to each of the APDs 11 and 101, the temperature compensation diodes 12 and 102, and the peripheral carrier absorbing portions 13 and 103. Thus, when a voltage is applied to the peripheral carrier absorbing portions 13, 83, 88, 89, 93, 98, and 103, the carriers generated in the temperature compensation diodes 12, 82, 87, 92, 97, and 102 can be further absorbed.

In each of the semiconductor substrates 10, 10A, 10B, 10C, 10D, 10E, and 10F, the APDs 11, 81, 86, 91, 96, and 101, the temperature compensation diodes 12, 82, 87, 92, 97, and 102, and the peripheral carrier absorbing portions 13, 83, 88, 89, 93, 98, and 103 are connected to the electrode 45 in parallel with each other. For example, since the APD 11 and the temperature compensation diode 12 are connected in parallel to each other, a potential corresponding to the breakdown voltage of the temperature compensation diode 12 can be applied to the APD 11. Since the peripheral carrier absorbing portion 13 is also connected in parallel to the APD 11 and the temperature compensation diode 12, a potential can be applied to the peripheral carrier absorbing portion 13 without providing a separate power supply. When a voltage is applied to the peripheral carrier absorbing portions 13, 83, 88, 89, 93, 98, and 103, the carriers generated in the temperature compensation diodes 12, 82, 87, 92, 97, and 102 can be further absorbed.

As illustrated in FIG. 1, the semiconductor substrate 10 includes the semiconductor region 21 of the first conductivity type. Each of the APD 11 and the temperature compensation diode 12 includes the semiconductor layer 31 and the semiconductor layer 32. The semiconductor layer 31 is a second conductivity type. The semiconductor layer 32 is a first conductivity type having a higher impurity concentration than the semiconductor region 21. The semiconductor layer 32 is located between the semiconductor region 21 and the semiconductor layer 31. As described above, the temperature compensation diodes 12, 82, 87, 92, and 97 have the same configuration as the APDs 11, 81, 86, 91, and 96. Therefore, it is possible to easily form the temperature compensation diodes 12, 82, 87, 92, and 97 whose temperature characteristics with respect to the amplification factor and the bias voltage are very similar to those of the APDs 11, 81, 86, 91, and 96.

In the semiconductor substrates 10, 10A, 10B, 10C, 10D, and 10E including the reach-through type APDs 11, 81, 86, 91, and 96, respectively, each of the peripheral carrier absorbing portions 13, 83, 88, 89, 93, and 98 includes the semiconductor layer 33 of the second conductivity type. Therefore, the carriers generated in the temperature compensation diodes 12, 82, 87, 92, and 97 can be further absorbed at the peripheral carrier absorbing portions 13, 83, 88, 89, 93, and 98.

The semiconductor substrate 10F includes the semiconductor region 21 of the first conductivity type. Each of the APD 101 and the temperature compensation diode 102 includes the semiconductor layer 35 and the semiconductor layer 36. In the semiconductor substrate 10F, the semiconductor layer 35 is a second conductivity type. The semiconductor layer 36 is a first conductivity type having a higher impurity concentration than the semiconductor region 21. The semiconductor layer 36 is located between the semiconductor region 21 and the semiconductor layer 35. As described above, the temperature compensation diode 102 has the same configuration as the APD 101. Therefore, it is possible to easily form the temperature compensation diode 102 whose temperature characteristics with respect to the amplification factor and the bias voltage are very similar to those of the APD 101.

In the semiconductor substrate 10F including the reverse type APD 101, the peripheral carrier absorbing portion 103 includes the semiconductor layer 33 of the first conductivity type. Therefore, the carriers generated due to the temperature compensation diode 102 can be further absorbed at the peripheral carrier absorbing portion 103.

In the semiconductor substrates 10, 10A, 10B, 10C, 10D, and 10E, the impurity concentration in the semiconductor layer 32 of each of the temperature compensation diodes 12, 82, 87, 92, and 97 is higher than the impurity concentration in the semiconductor layer 32 of each of the APDs 11, 81, 86, 91, and 96. In this case, in the light detection device 1, for example, the breakdown voltage of each of the APDs 11, 81, 86, 91, and 96 is higher than the breakdown voltage of each of the temperature compensation diodes 12, 82, 87, 92, and 97. As a result, temperature compensation is ensured for the multiplication factors of the APDs 11, 81, 86, 91, and 96 operating in the linear mode. In addition, when the APD 101 of the semiconductor substrate 10F is operated in the linear mode, the semiconductor substrate 10F is configured such that the impurity concentration in the semiconductor layer 36 of the temperature compensation diode 102 is higher than the impurity concentration in the semiconductor layer 36 of the APD 101. In this case, in the light detection device 1F, for example, the breakdown voltage of the APD 101 is higher than the breakdown voltage of the temperature compensation diode 102.

In the semiconductor substrate 10F, the impurity concentration in the semiconductor layer 36 of the temperature compensation diode 102 may be lower than the impurity concentration in the semiconductor layer 36 of the APD 101. In this case, in the light detection device 1F, for example, the breakdown voltage of the APD 101 may be lower than the breakdown voltage of the temperature compensation diode 102.

As a result, temperature compensation can be ensured for the multiplication factor of the APD 101 arranged to operate in Geiger mode. In addition, when the APDs 11, 81, 86, 91, and 96 of the semiconductor substrates 10, 10A, 10B, 10C, 10D, and 10E are arranged to operate in Geiger mode, the semiconductor substrates 10, 10A, 10B, 10C, 10D, and 10E are configured such that the impurity concentration in the semiconductor layer 32 of each of the temperature compensation diodes 12, 82, 87, 92, and 97 is lower than the impurity concentration in the semiconductor layer 32 of each of the APDs 11, 81, 86, 91, and 96. In this case, in the light detection device 1, for example, the breakdown voltages of the APDs 11, 81, 86, 91, and 96 are lower than the breakdown voltages of the temperature compensation diodes 12, 82, 87, 92, and 97.

Figure 13:
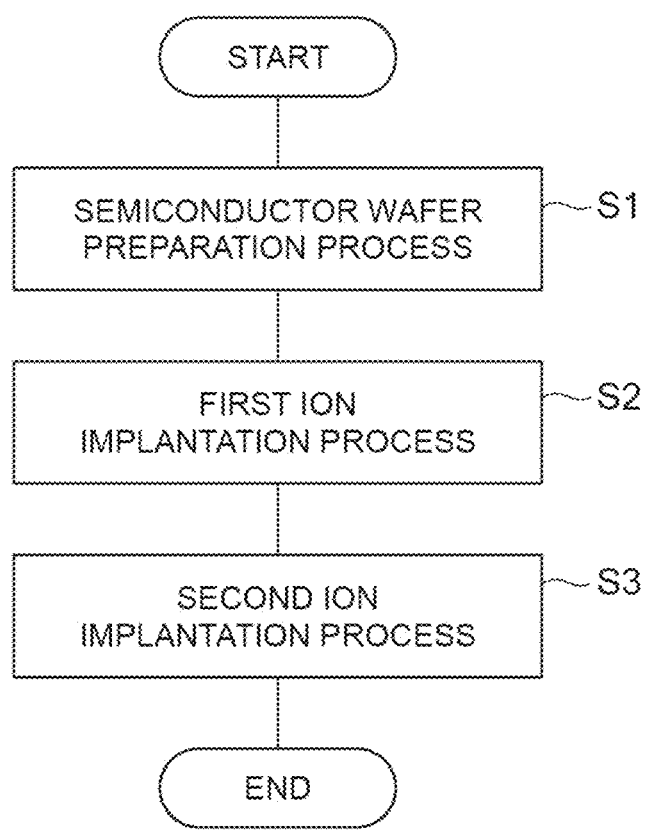
FIG. 13 is a flowchart for describing a method for manufacturing a semiconductor substrate.

Next, an example of a method for manufacturing a light detection device will be described with reference to FIG. 13. FIG. 13 is a flowchart illustrating a method for manufacturing the semiconductor substrate 10 in the light detection device 1.

First, a semiconductor wafer is prepared (step S1). The semiconductor wafer is a substrate before being processed as the semiconductor substrate 10, and has main surfaces 10a and 10b facing each other. The semiconductor wafer has a semiconductor region of a first conductivity type corresponding to the semiconductor region 21. The semiconductor region is provided on the main surface 10a side of the semiconductor wafer, and forms the entire main surface 10a. For example, the semiconductor region of the semiconductor wafer is $P^-$ type. In the present embodiment, the semiconductor layer 35 of the first conductivity type having an impurity concentration higher than the semiconductor region of the semiconductor wafer is formed in the semiconductor wafer by adding impurities from the main surface 10b side. For example, the semiconductor layer 35 is $P^+$ type.

Subsequently, as first ion implantation process (step S2), impurity ions are implanted to the main surface 10a side using an ion implantation method to add impurities, forming the semiconductor layers 31 and 33 of the second conductivity type and the semiconductor layers 32 and 34 of the first conductivity type. For example, the semiconductor layers 31 and 33 are $N^+$ type, the semiconductor layer 32 is P type, and the semiconductor layer 34 is $P^+$ type. In the present embodiment, the semiconductor layer 31 and the semiconductor layer 33 are formed by implanting second conductivity type impurity ions into different portions spaced apart from each other in one ion implantation process. The semiconductor layer 32 is formed by implanting first conductivity type impurity ions after the semiconductor layers 31 and 33 are formed. The semiconductor layer 32 may be formed by implanting first conductivity type impurity ions before the semiconductor layers 31 and 33 are formed.

The semiconductor layers 31 and 32 are formed at locations overlapping each other when viewed from the direction perpendicular to the main surface 10*a*. The semiconductor layer 32 is formed by implanting first conductivity type impurities at a location deeper than the semiconductor layer 31 when viewed from the main surface 10*a* side. The semiconductor layers 31 and 32 are formed in a plurality of portions, which are spaced apart from each other when viewed from the direction perpendicular to the main surface 10*a*, in a region serving as one semiconductor substrate 10. The plurality of portions include a portion where the APD 11 is disposed and a portion where the temperature compensation diode 12 is disposed. In the first ion implantation process, second conductivity type impurities are added to each portion so that the impurity concentration of the semiconductor layer 31 is equal to each other. Similarly, first conductivity type impurities are added to each portion so that the impurity concentration of the semiconductor layer 31 is equal to each other.

Subsequently, as second ion implantation process (step S3), impurities are further added to the semiconductor layer 32 only in some of the above-described plurality of portions using an ion implantation method. In the present embodiment, the first conductivity type impurities are further implanted into the semiconductor layer 32 only in a portion where the temperature compensation diode 12 is disposed. For this reason, in the light detection device 1, the impurity concentration in the semiconductor layer 32 of the temperature compensation diode 12 is higher than the impurity concentration in the semiconductor layer 32 of the APD 11. In this case, the light detection device 1 is configured such that the breakdown voltage of the APD 11 is higher than the breakdown voltage of the temperature compensation diode 12.

In the second ion implantation process, the first conductivity type impurities may be further implanted into the semiconductor layer 32 only in a portion where the APD 11 is disposed, not in a portion where the temperature compensation diode 12 is disposed. In this case, in the light detection device 1, the impurity concentration in the semiconductor layer 32 of the temperature compensation diode 12 is lower than the impurity concentration in the semiconductor layer 32 of the APD 11. The light detection device in this case is configured such that the breakdown voltage of the APD 11 is lower than the breakdown voltage of the temperature compensation diode 12.

By the processes described above, the semiconductor substrate 10 of the light detection device 1 is formed. In the present embodiment, the semiconductor layers 31, 32, 33, and 34 are formed from the state in which the semiconductor layer 35 has already been formed. However, the semiconductor layer 35 may be formed after the semiconductor layers 31, 32, 33, and 34 are formed.

In the manufacturing method described above, the semiconductor layer 31 and the semiconductor layer 32 are formed in each portion by implanting ions into a plurality of different portions. Thereafter, ions are further implanted into the semiconductor layer 32 in some of the portions. Therefore, the temperature compensation diode 12 and the APD 11 each of which is set to the desired breakdown voltage can be easily manufactured while having the same temperature characteristics with respect to the multiplication factor and the bias voltage. In this case, for example, the multiplication factor of the APD 11 can be arbitrarily set according to the breakdown voltage difference between the temperature compensation diode 12 and the APD 11. Therefore, when each of the temperature compensation diode 12 and the APD 11 is set to the desired breakdown voltage, the detection accuracy can be improved. For example, when the multiplication factor of the APD 11 is set to the optimal multiplication factor Mopt having a high S/N ratio according to the breakdown voltage difference between the temperature compensation diode 12 and the APD 11, the detection accuracy can be improved. Thus, in the manufacturing method described above, temperature compensation is ensured for the multiplication factor while suppressing the manufacturing cost, enabling improvement the detection accuracy.

In the present embodiment, in the first ion implantation process, the semiconductor layer 31 and the semiconductor layer 33 are formed by one ion implantation process. For this reason, the peripheral carrier absorbing portion 13 is formed without increasing the number of ion implantation processes. Therefore, the manufacturing cost is reduced.

While the embodiment of the present invention and the modification examples have been described above, the present invention is not necessarily limited to the embodiment and the modification examples described above, and various changes can be made without departing from the scope of the present invention.

For example, the manufacturing method described above can be applied not only to the manufacturing of the semiconductor substrate 10 of the light detection device 1 but also to the manufacturing of the semiconductor substrates 10A, 10B, 10C, 10D, and 10E. The manufacturing method described above can be applied not only to the manufacturing of the light detection device 1 but also to the manufacturing of the light detection device 1F.

In the semiconductor substrates 10B, 10C, 10D, and 10E, the peripheral carrier absorbing portion may surround a plurality of APDs included in the APD array. In other words, the peripheral carrier absorbing portion may surround a plurality of APDs included in the APD array one by one. Any APD included in the APD array may be used as a temperature compensation diode. Also in this case, the carriers generated from the APD used as a temperature compensation diode are suppressed from reaching the other APDs.

In the above modification examples, the configuration in which the semiconductor substrate 10F includes the semiconductor layer 36 has been described. However, the APD 101 of the semiconductor substrate 10F does not have to include the semiconductor layer 36. Even in this case, the APD 101 of the semiconductor substrate 10F functions as an APD. In the configuration in which the semiconductor substrate 10F does not include the semiconductor layer 36, for example, the semiconductor region 21 and the semiconductor layer 35 are in contact with each other without the semiconductor layer 36 interposed therebetween.

REFERENCE SIGNS LIST

1, 1F: light detection device, 10, 10A, 10B, 10C, 10D, 10E, 10F: semiconductor substrate, 10*a*, 10*b*: main surface, 11, 81, 81*a*, 86, 86*a*, 91, 91*a*, 96, 96*a*, 101: APD, 11*a*, 101*a*: light incidence surface, 12, 82, 87, 92, 97, 102: temperature compensation diode, 13, 83, 88, 89, 93, 98, 103: peripheral carrier absorbing portion, 13a, 13b, 83a, 83b, 88a, 88b, 89a, 89b, 93a, 93b, 98a, 98b, 103a, 103b: edge, 13c, 83c, 88c, 89c, 103c: portion, 21: semiconductor region, 31, 32, 33, 36: semiconductor layer, 42, 43, 44, 45: electrode, 80, 85a, 85b, 90, 95: APD array, L1, L2, L3, L4: distance.

The invention claimed is:

1. A light detection device, comprising:
a semiconductor substrate that has a first main surface and a second main surface facing each other and forms an avalanche photodiode and a temperature compensation diode so as to be spaced apart from each other when viewed from a direction perpendicular to the first main surface,
wherein:
the semiconductor substrate includes a peripheral carrier absorbing portion surrounding the avalanche photodiode when viewed from the direction perpendicular to the first main surface and configured to absorb carriers located at a periphery,
a part of the peripheral carrier absorbing portion is located between the avalanche photodiode and the temperature compensation diode when viewed from the direction perpendicular to the first main surface, and
a voltage corresponding to a breakdown voltage of the temperature compensation diode is applied to the temperature compensation diode, and the voltage is applied to the avalanche photodiode as a bias voltage.

2. The light detection device according to claim 1,
wherein an avalanche photodiode array including the avalanche photodiode is formed on a side of the first main surface of the semiconductor substrate,
the peripheral carrier absorbing portion surrounds the avalanche photodiode array when viewed from the direction perpendicular to the first main surface, and
a part of the peripheral carrier absorbing portion is located between the avalanche photodiode array and the temperature compensation diode when viewed from the direction perpendicular to the first main surface.

3. The light detection device according to claim 1, further comprising:
a first electrode connected to the avalanche photodiode and configured to output a signal from the avalanche photodiode;
a second electrode connected to the temperature compensation diode; and
a third electrode connected to the peripheral carrier absorbing portion.

4. The light detection device according to claim 3, further comprising:
a fourth electrode to which the avalanche photodiode, the temperature compensation diode, and the peripheral carrier absorbing portion are connected in parallel with each other.

5. The light detection device according to claim 1,
wherein the semiconductor substrate includes a semiconductor region of a first conductivity type, and
each of the avalanche photodiode and the temperature compensation diode includes a first semiconductor layer of a second conductivity type different from the first conductivity type and a second semiconductor layer of the first conductivity type, the second semiconductor layer being disposed between the semiconductor region and the first semiconductor layer and having a higher impurity concentration than the semiconductor region.

6. The light detection device according to claim 5,
wherein the peripheral carrier absorbing portion includes a third semiconductor layer of the second conductivity type.

7. The light detection device according to claim 5,
wherein the peripheral carrier absorbing portion includes a third semiconductor layer of the first conductivity type.

8. The light detection device according to claim 6,
wherein an impurity concentration in the second semiconductor layer of the temperature compensation diode is higher than an impurity concentration in the second semiconductor layer of the avalanche photodiode.

9. The light detection device according to claim 6,
wherein an impurity concentration in the second semiconductor layer of the temperature compensation diode is lower than an impurity concentration in the second semiconductor layer of the avalanche photodiode.

10. The light detection device according to claim 1, wherein the bias voltage changes according to an ambient temperature.

11. A light detection device, comprising:
a semiconductor substrate having a first main surface and a second main surface facing each other,
wherein the semiconductor substrate includes:
a first avalanche photodiode having a light incidence surface on a side of the first main surface;
a second avalanche photodiode that is spaced apart from the first avalanche photodiode when viewed from a direction perpendicular to the first main surface and is shielded from light; and
a peripheral carrier absorbing portion surrounding the first avalanche photodiode when viewed from the direction perpendicular to the first main surface and configured to absorb carriers located at a periphery, and
a part of the peripheral carrier absorbing portion is located between the first avalanche photodiode and the second avalanche photodiode when viewed from the direction perpendicular to the first main surface.

12. A method for manufacturing the light detection device according to claim 1, comprising:
preparing a semiconductor wafer having the first main surface and including a semiconductor region of a first conductivity type;
a first ion implantation process of implanting ions into a first portion and a second portion in the semiconductor wafer to form, in each of the first and second portions, a first semiconductor layer of a second conductivity type different from the first conductivity type and a second semiconductor layer of the first conductivity type, the first portion and the second portion being spaced apart from each other when viewed from the direction perpendicular to the first main surface, the second semiconductor layer being located between the semiconductor region and the first semiconductor layer and having a higher impurity concentration than the semiconductor region, and
a second ion implantation process of further implanting ions into the second semiconductor layer in the first portion.

13. The method for manufacturing a light detection device according to claim 12,
wherein the first ion implantation process includes:

implanting impurity ions of the second conductivity type into the first and second portions and a third portion being spaced apart from the first and second portions when viewed from the direction perpendicular to the first main surface, to form the first semiconductor layer in each of the first and second portions and form a third semiconductor layer of the second conductivity type in the third portion, by one ion implantation process, and implanting impurity ions of the first conductivity type into the first and second portions to form the second semiconductor layer in each of the first and second portions.

* * * * *